United States Patent
Shimasaki et al.

(10) Patent No.: US 9,288,894 B2
(45) Date of Patent: Mar. 15, 2016

(54) COUPLER APPARATUS

(75) Inventors: Hiroshi Shimasaki, Kunitachi (JP); Masao Teshima, Kunitachi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 1263 days.

(21) Appl. No.: 12/976,552

(22) Filed: Dec. 22, 2010

(65) Prior Publication Data

US 2011/0156980 A1 Jun. 30, 2011

(30) Foreign Application Priority Data

Dec. 24, 2009 (JP) ................ 2009-293275
Apr. 8, 2010 (JP) ................ 2010-089771

(51) Int. Cl.
| | | |
|---|---|---|
| H01Q 1/48 | (2006.01) | |
| H01Q 1/38 | (2006.01) | |
| H01Q 9/04 | (2006.01) | |
| H05K 1/02 | (2006.01) | |
| H01Q 1/22 | (2006.01) | |
| H01Q 9/26 | (2006.01) | |

(52) U.S. Cl.
CPC ........... *H05K 1/0253* (2013.01); *H01Q 1/2266* (2013.01); *H01Q 1/38* (2013.01); *H01Q 1/48* (2013.01); *H01Q 9/0421* (2013.01); *H01Q 9/26* (2013.01); *H05K 1/0225* (2013.01)

(58) Field of Classification Search
CPC ..... H05K 1/0253; H05K 1/0225; H01Q 1/38; H01Q 9/26; H01Q 1/2266; H01Q 1/48; H01Q 9/0421
USPC ........................................... 343/778
See application file for complete search history.

(56) References Cited

U.S. PATENT DOCUMENTS

| | | | |
|---|---|---|---|
| 5,121,127 A * | 6/1992 | Toriyama | 343/700 MS |
| 6,144,344 A * | 11/2000 | Kim et al. | 343/700 MS |
| 6,255,995 B1 | 7/2001 | Asano et al. | |
| 6,559,802 B2 | 5/2003 | Goto et al. | |
| 6,563,463 B1 | 5/2003 | Saito | |
| 6,795,025 B2 | 9/2004 | Saito | |
| 6,836,247 B2 * | 12/2004 | Soutiaguine et al. | 343/700 MS |
| 6,897,815 B2 | 5/2005 | Goto et al. | |
| 6,995,709 B2 * | 2/2006 | Spittler | 343/700 MS |

(Continued)

FOREIGN PATENT DOCUMENTS

| | | |
|---|---|---|
| JP | 07-162225 | 6/1995 |
| JP | 2000-196341 | 7/2000 |

(Continued)

OTHER PUBLICATIONS

Explanation of Non-English Language Reference(s).

(Continued)

*Primary Examiner* — Hoang V Nguyen
*Assistant Examiner* — Michael Bouizza
(74) *Attorney, Agent, or Firm* — Knobbe, Martens, Olson & Bear LLP

(57) ABSTRACT

According to one embodiment, a coupler apparatus includes a coupling element and a ground plane. The coupling element is formed of a conductive material. The coupling element is subjected to power feeding to a reference point. The ground plane is formed of a conductive material. The ground plane faces the coupling element. The ground plane has a notch at a position facing at least a part of a portion of the coupling element except the reference point or near the position.

21 Claims, 21 Drawing Sheets

(56) References Cited

U.S. PATENT DOCUMENTS

| | | |
|---|---|---|
| 7,304,611 B2 | 12/2007 | Yuanzhu |
| 2002/0167446 A1 | 11/2002 | Goto et al. |
| 2003/0169204 A1 | 9/2003 | Saito |
| 2003/0189520 A1 | 10/2003 | Goto et al. |
| 2004/0263400 A1 | 12/2004 | Yuanzhu |
| 2008/0076351 A1 | 3/2008 | Washiro |
| 2010/0019976 A1* | 1/2010 | Sakiyama et al. ..... 343/700 MS |

FOREIGN PATENT DOCUMENTS

| | | |
|---|---|---|
| JP | 2000-332523 | 11/2000 |
| JP | 2001-196828 | 7/2001 |
| JP | 2002-325014 | 11/2002 |
| JP | 2005-039754 | 2/2005 |
| JP | 2005-204244 | 7/2005 |
| JP | 2006-229528 | 8/2006 |
| JP | 2007-251570 | 9/2007 |
| JP | 2008-033464 | 2/2008 |
| JP | 2008-099236 | 4/2008 |

OTHER PUBLICATIONS

Office Action dated Apr. 26, 2011 in Japanese Application No. 2010-089771.

* cited by examiner

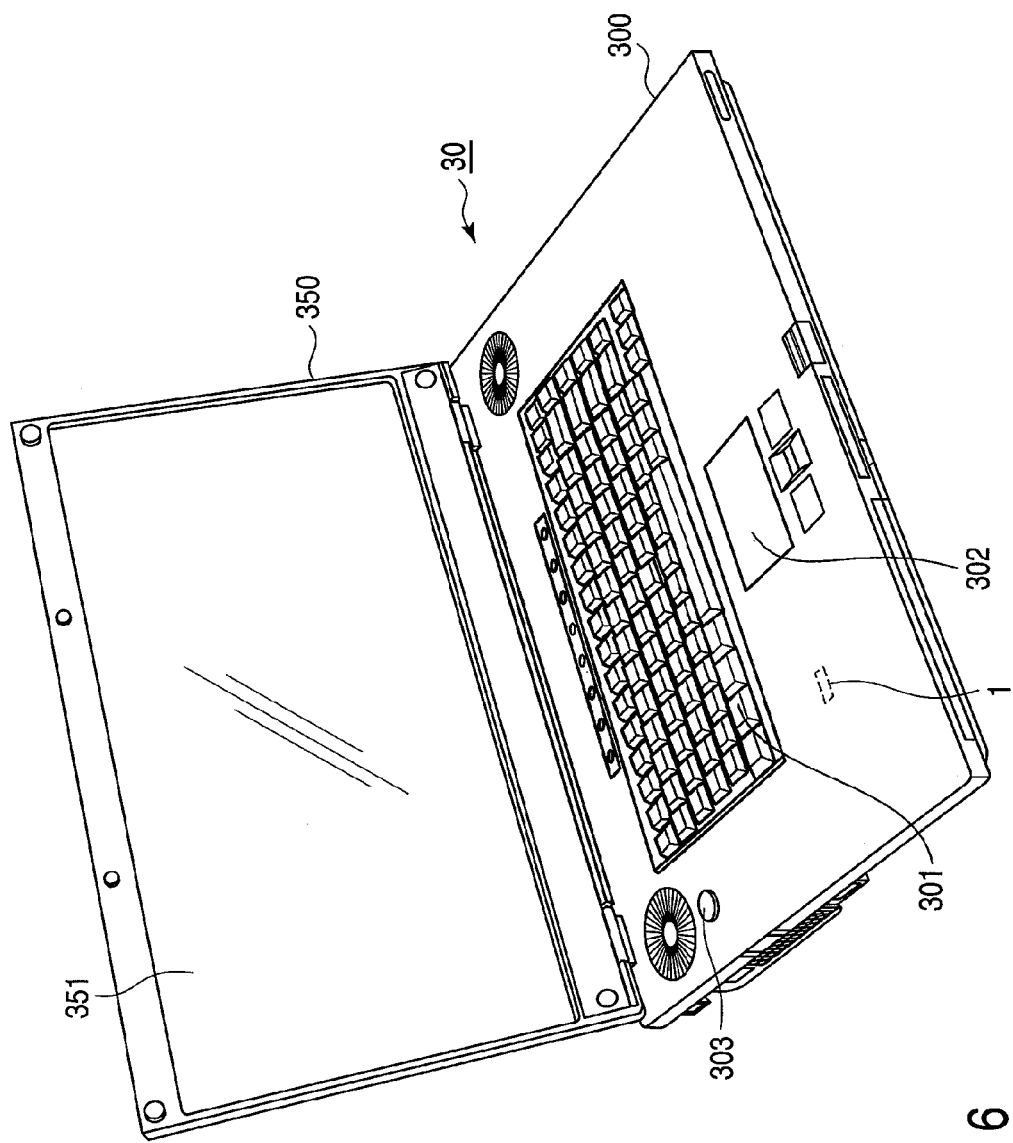
F I G. 6

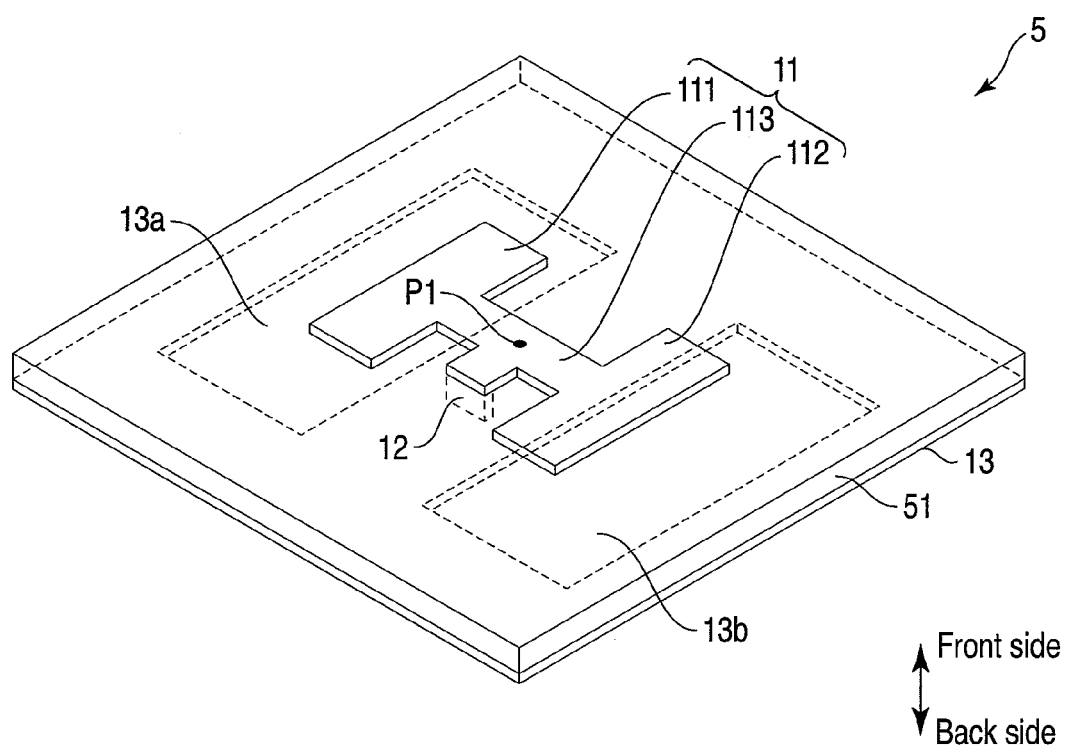
F I G. 11

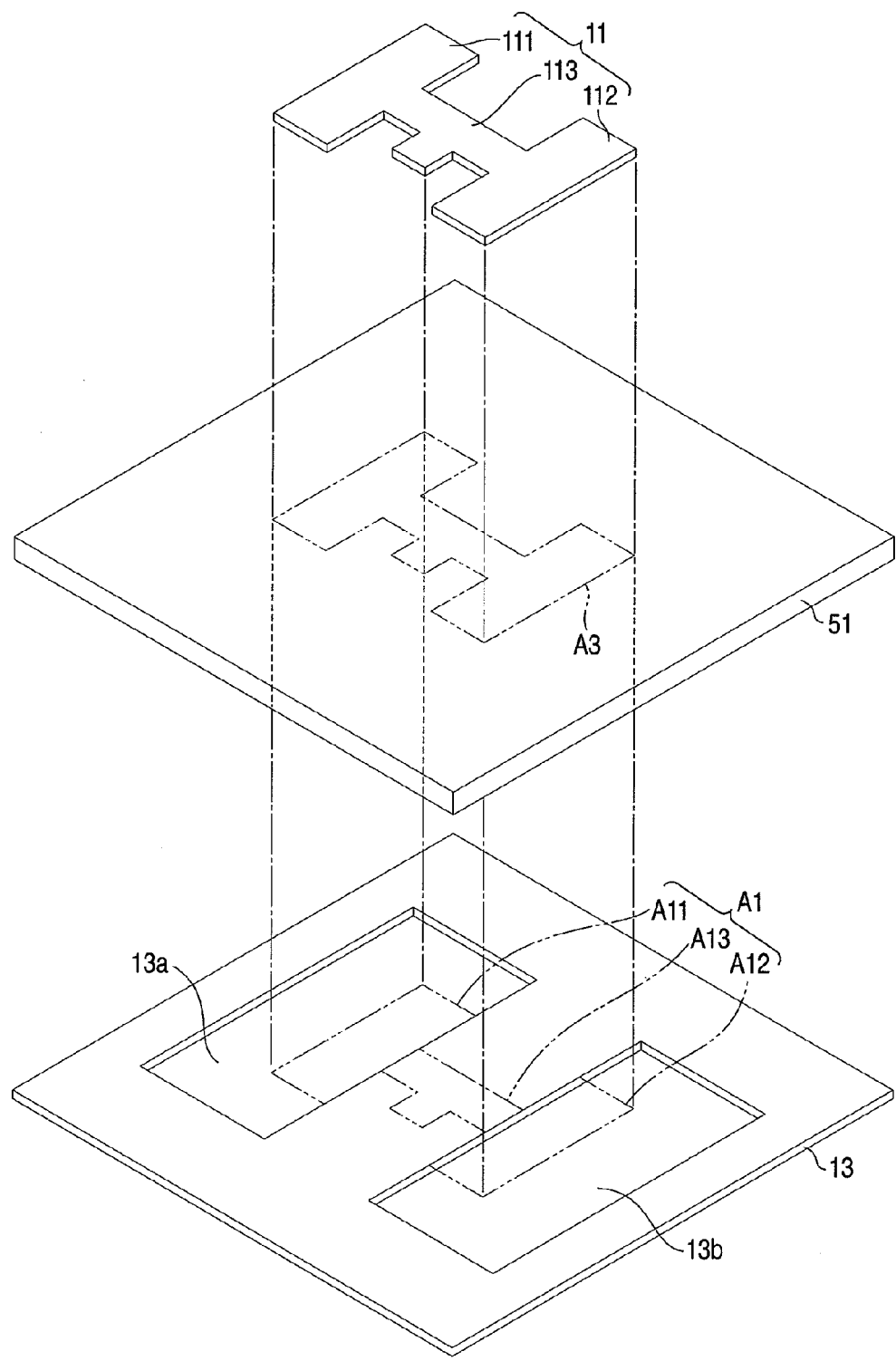
F I G. 12

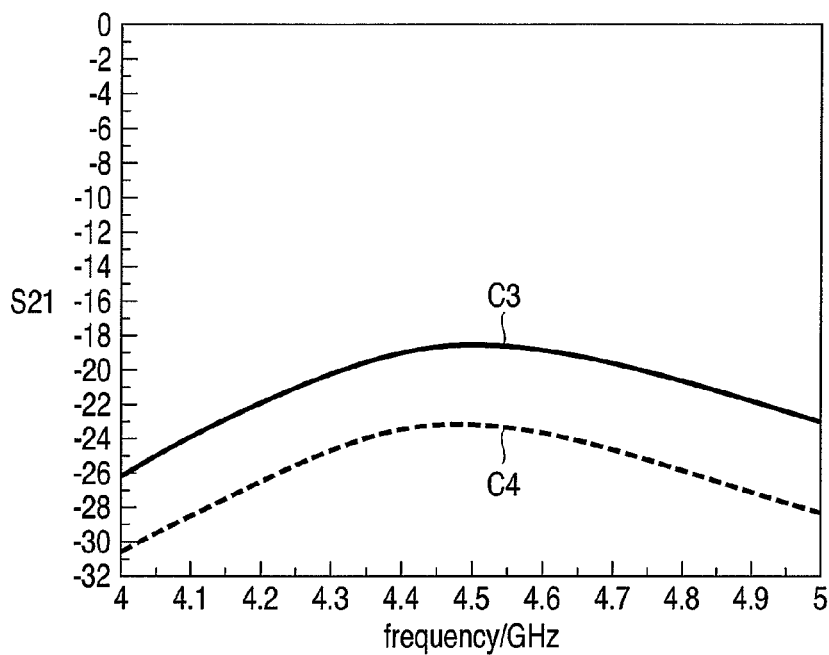
F I G. 13
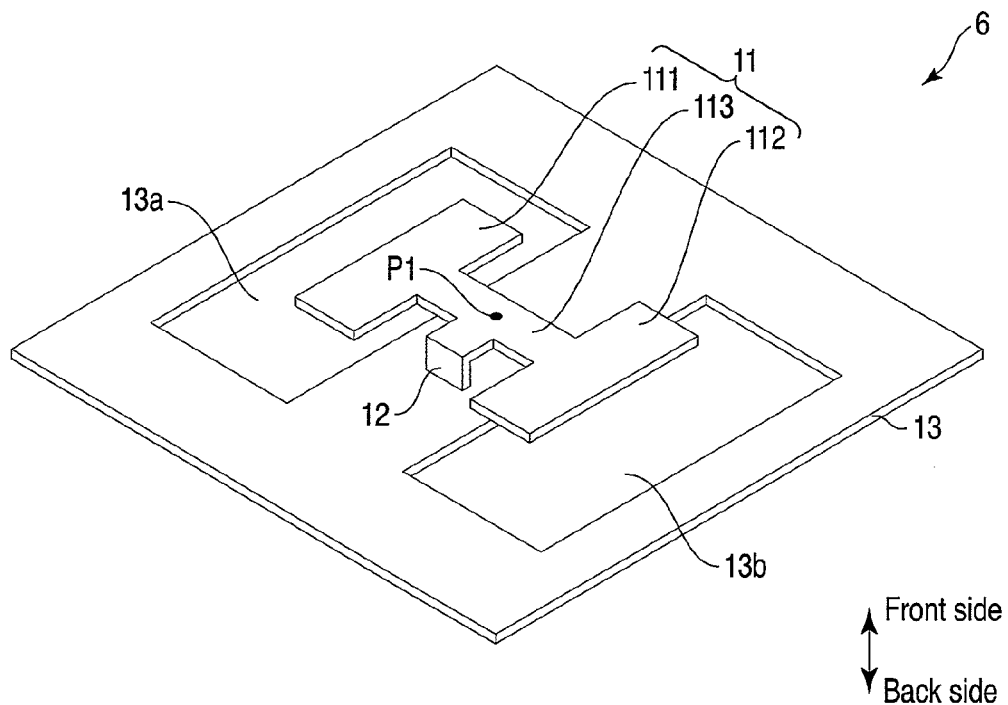
F I G. 14

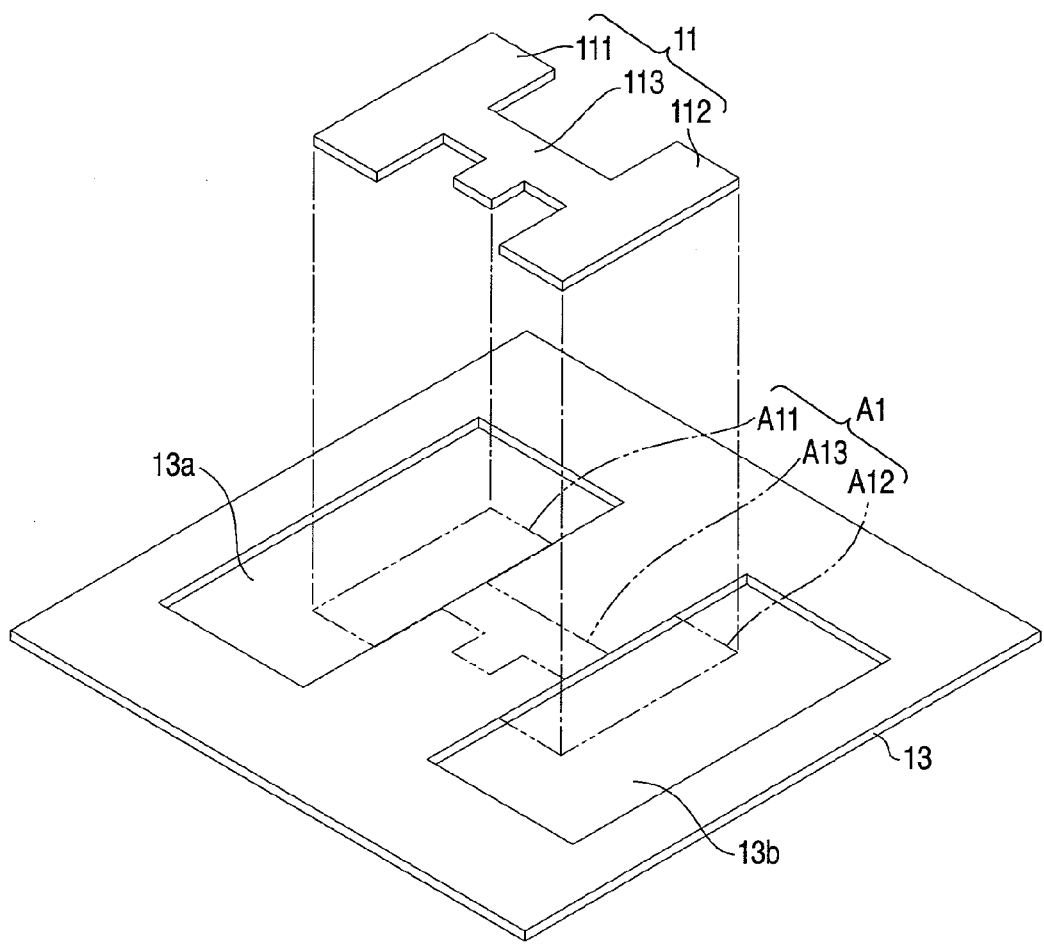
F I G. 15

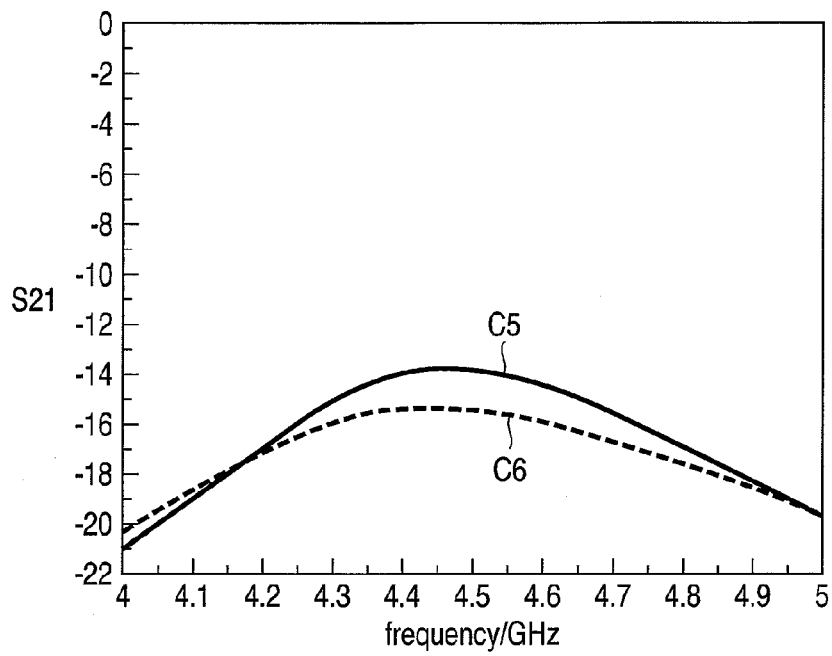
F I G. 16
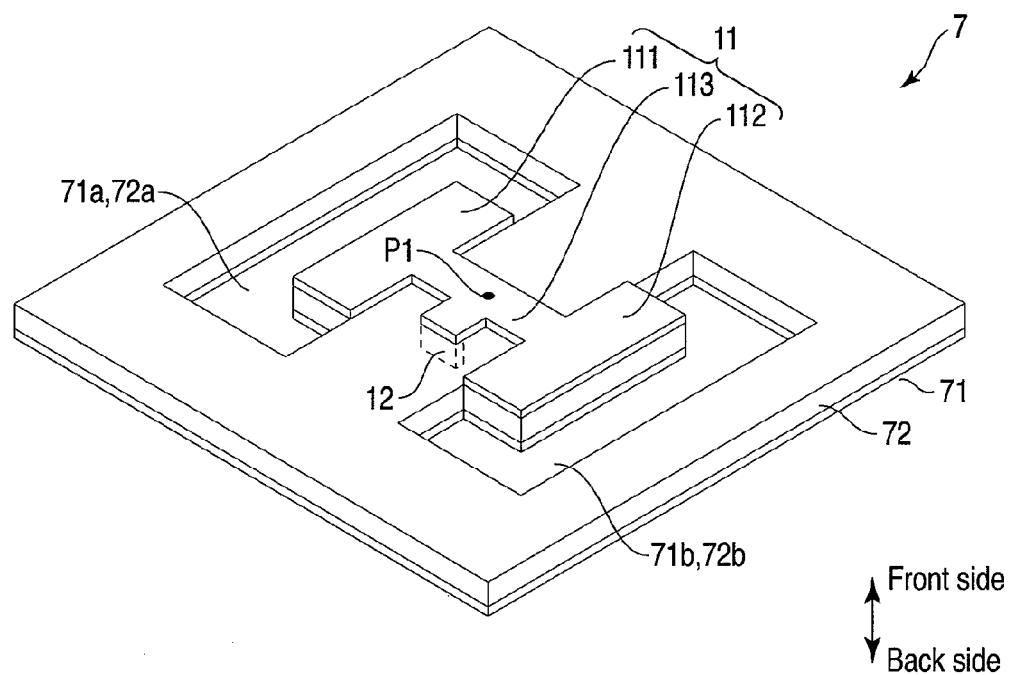
F I G. 17

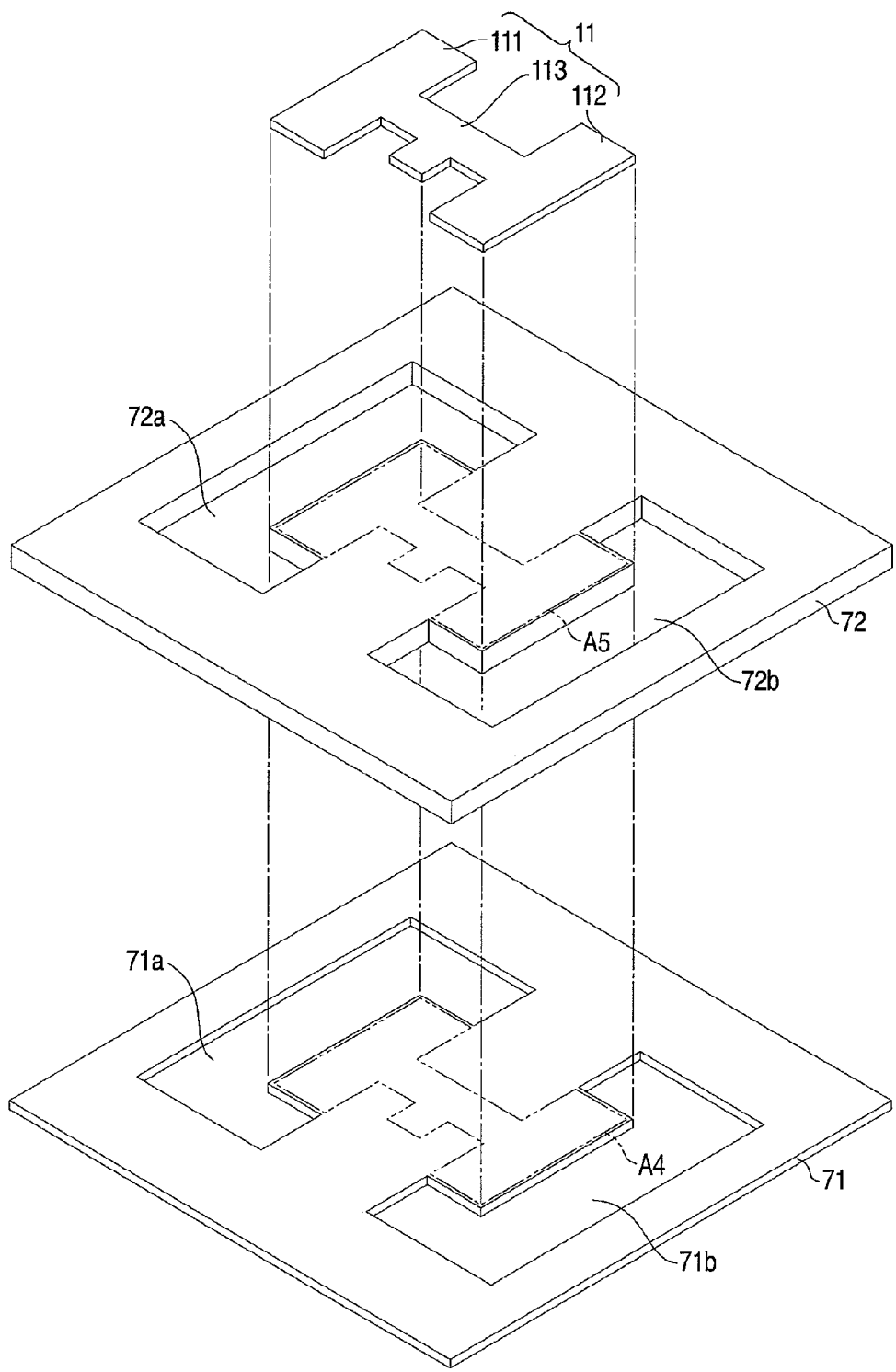
F I G. 18

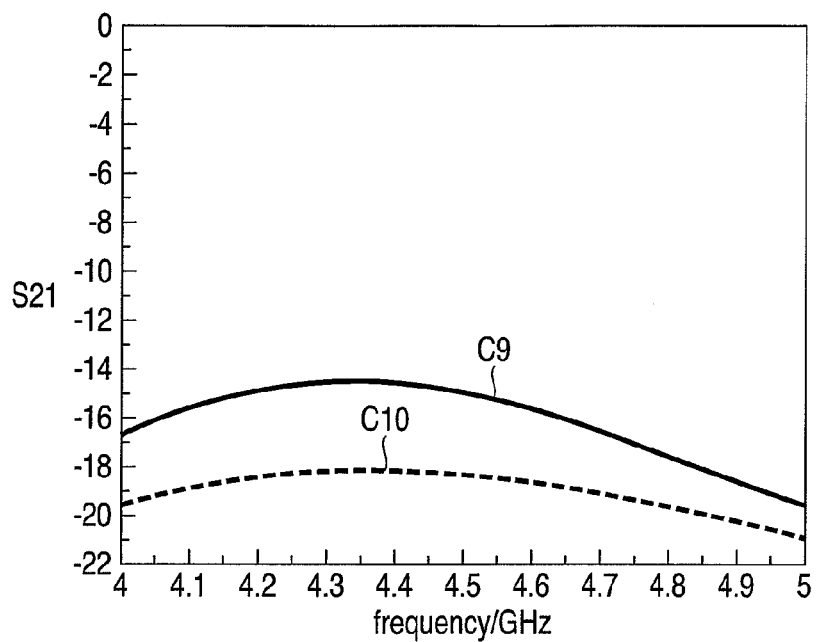
F I G. 22
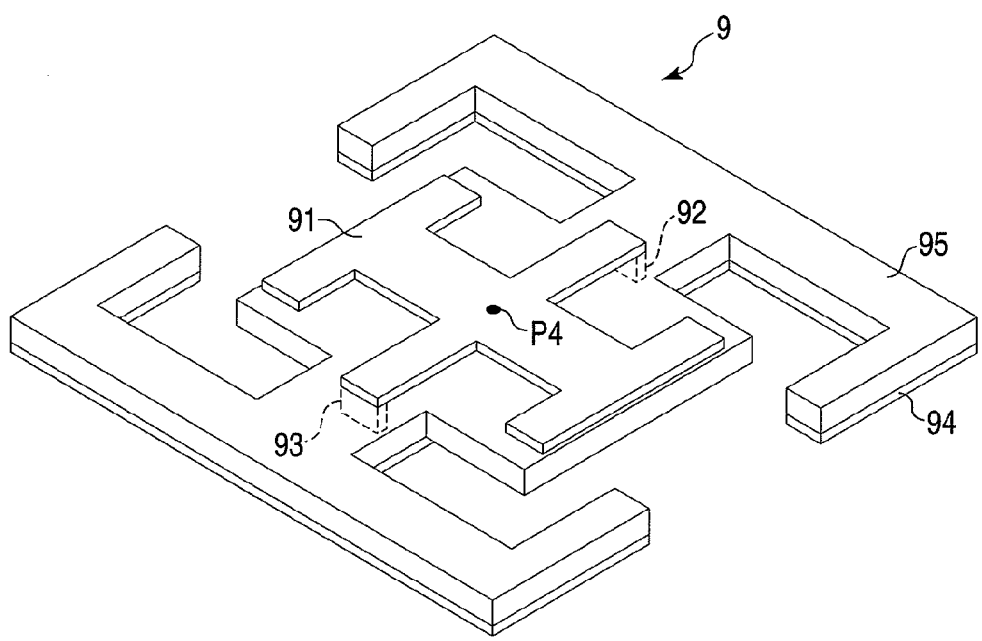
F I G. 23

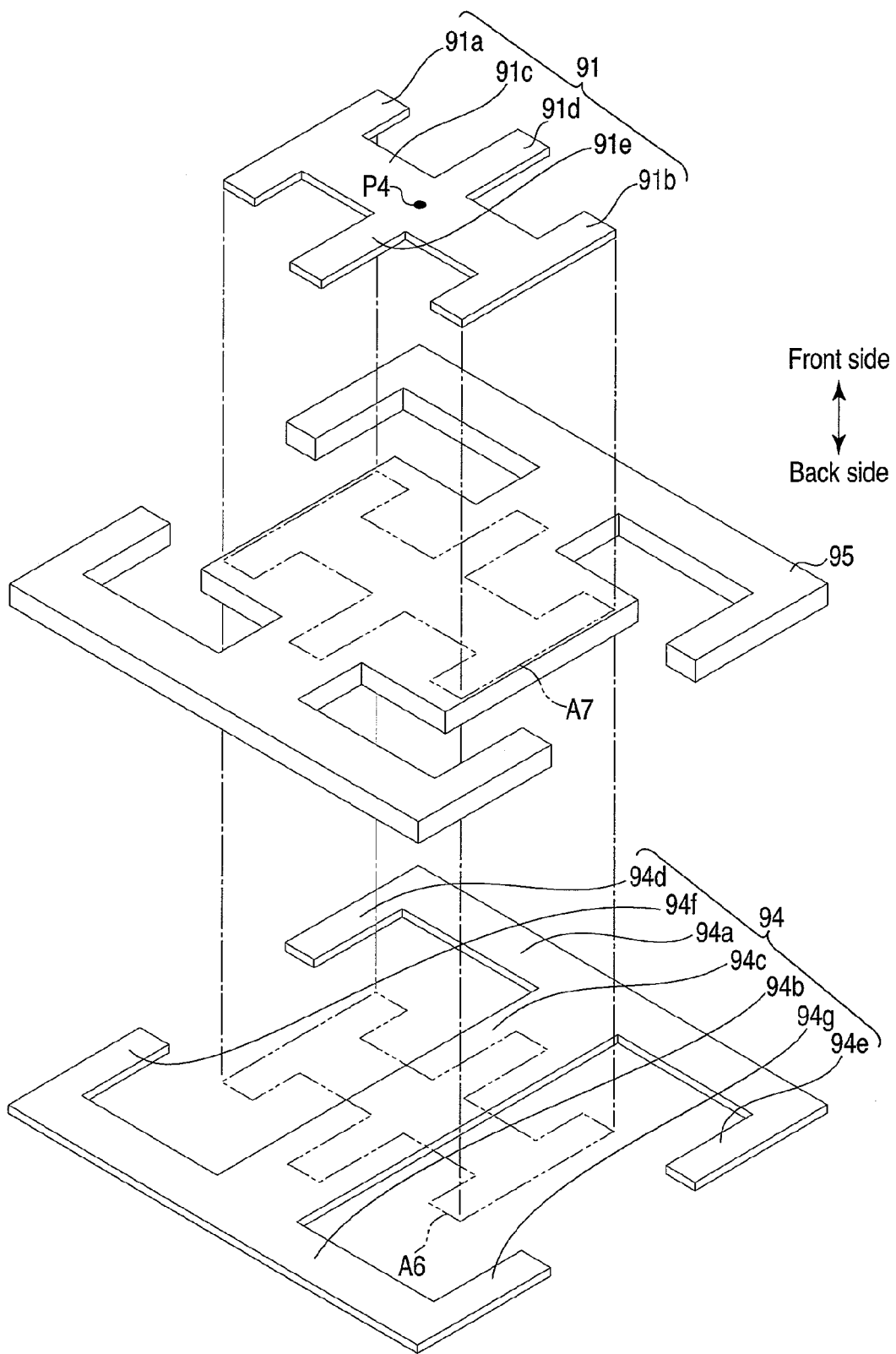
F I G. 24

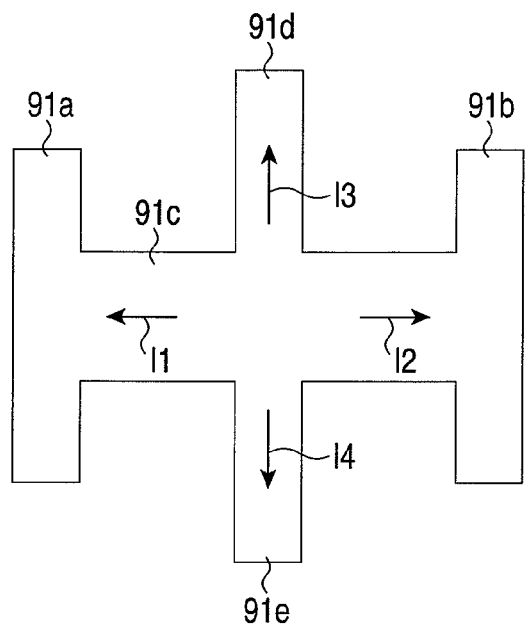
F I G. 25
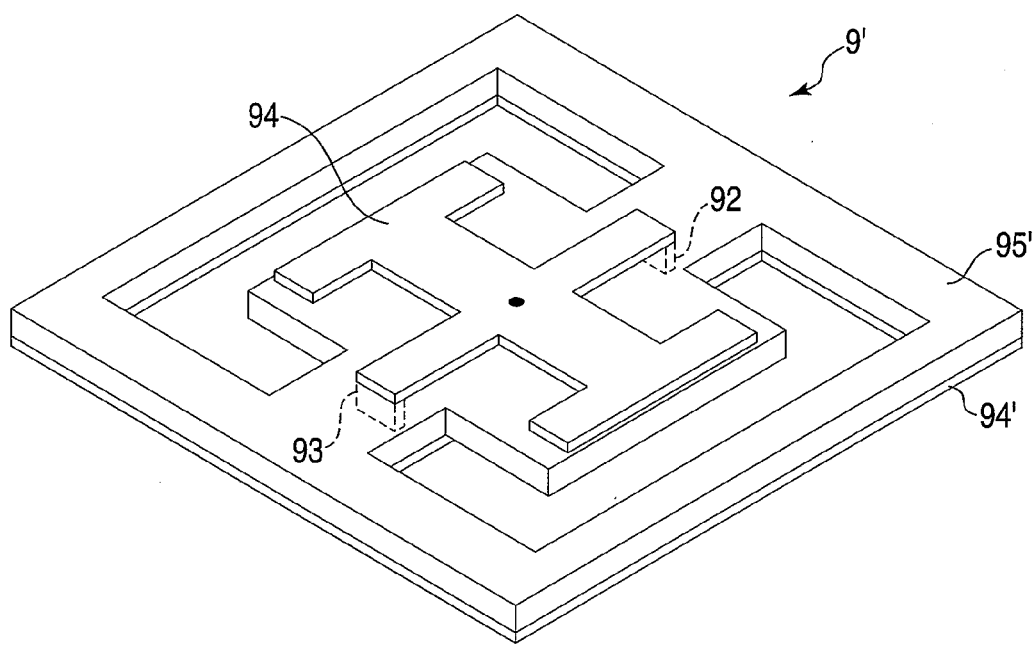
F I G. 26

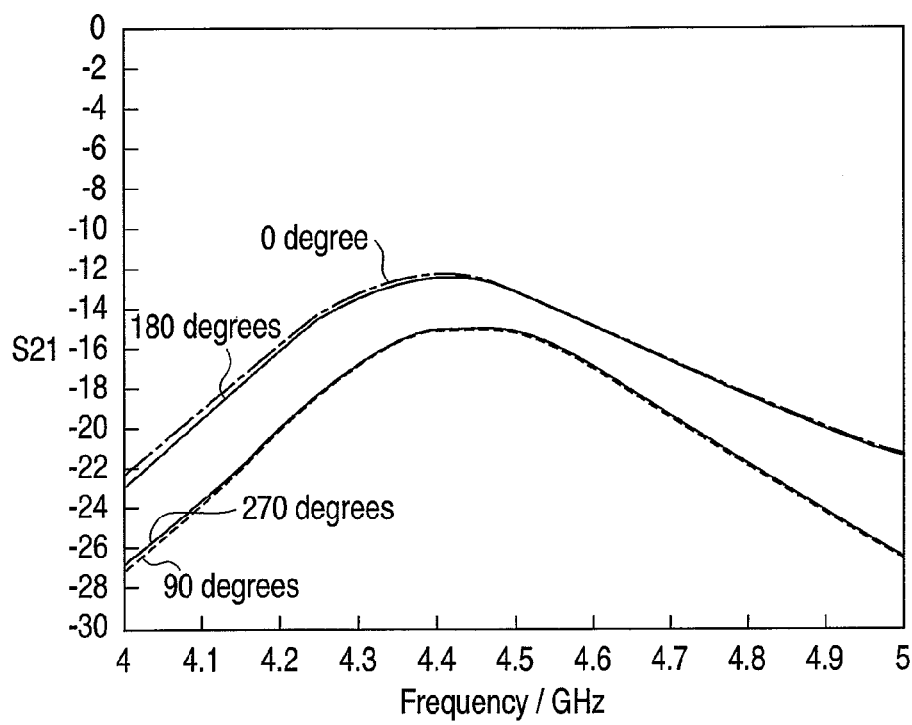
F I G. 28
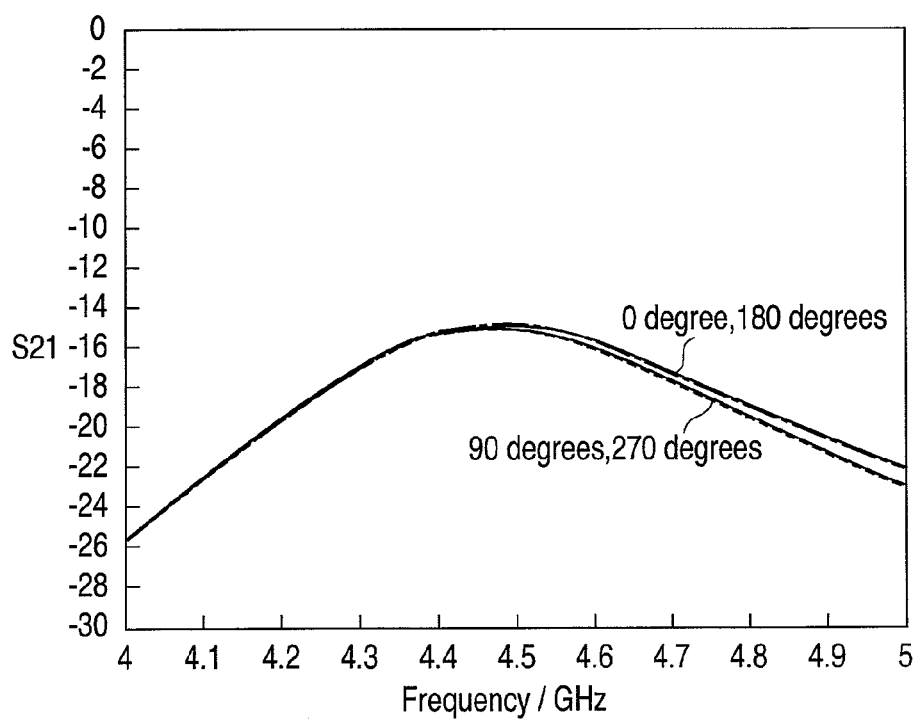
F I G. 29

COUPLER APPARATUS

CROSS-REFERENCE TO RELATED APPLICATIONS

This application is based upon and claims the benefit of priority from Japanese Patent Applications No. 2009-293275, filed Dec. 24, 2009; and No. 2010-089771, filed Apr. 8, 2010; the entire contents of both of which are incorporated herein by reference.

FIELD

Embodiments described herein relate generally to a coupler apparatus.

BACKGROUND

Development of Transfer JET has advanced as a proximity wireless communication system between two communication devices which are in proximity to each other to form a gap of approximately several cm therebetween.

To perform communication by utilizing this type of proximity wireless communication system, coupler apparatuses having two communication devices mounted thereon, respectively, are proximally positioned to face each other. Each coupler apparatus includes a coupling element and utilizes electromagnetic coupling between the coupling elements to transmit or receive electromagnetic waves.

In general, a coupler apparatus is constituted by arranging a coupling element and a ground plane, each of which is obtained by forming a conductive material into a tabular shape, to face each other. Further, in the coupler apparatus on a transmission side, an electromagnetic field is generated around the coupler apparatus by feeding a signal to a portion between the coupling element and the ground plane to generate an electric current in the coupling element, thereby producing electromagnetic coupling between this coupler apparatus and a coupler apparatus on a reception side. In the coupler apparatus on the reception side, the above-described signal can be fetched as a potential difference between the coupling element and the ground plane when the electric current is generated in the coupling element based on the produced electromagnetic coupling.

Since the coupler apparatus has the above-described principle, the coupling element and the ground plane are arranged in close proximity to each other. Therefore, a part of the electric current flows through the ground plane via a space, and a part of the fed energy becomes a loss without being utilized for the electromagnetic coupling.

Under such circumstances, reducing leakage of the electric current from the coupling element to the ground plane to efficiently improve a degree of coupling has been demanded.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 6 is a perspective view showing an appearance of an information processing apparatus as an example of a device on which the coupler apparatus depicted in FIG. 1 to FIG. 5 is mounted;

FIG. 11 is a perspective view of a coupler apparatus according to a second embodiment;

FIG. 12 is an exploded perspective view of the coupler apparatus depicted in FIG. 11;

FIG. 13 is a view showing a relationship between a frequency and a transmission coefficient (S21) in the coupler apparatus according to the second embodiment;

FIG. 14 is a perspective view of a coupler apparatus according to a third embodiment;

FIG. 15 is an exploded perspective view of the coupler apparatus depicted in FIG. 14;

FIG. 16 is a view showing a relationship between a frequency and a transmission factor (S21) in the coupler apparatus according to the third embodiment;

FIG. 17 is a perspective view of a coupler apparatus according to a fourth embodiment;

FIG. 18 is an exploded perspective view of the coupler apparatus depicted in FIG. 17;

FIG. 22 is a view showing a relationship between a frequency and a transmission coefficient (S21) in the coupler apparatus according to the modification;

FIG. 23 is a perspective view of a coupler apparatus according to a fifth embodiment;

FIG. 24 is an exploded perspective view of the coupler apparatus depicted in FIG. 23;

FIG. 25 is a view showing a part of an electric current generated in a coupling element depicted in FIG. 23 and FIG. 24;

FIG. 26 is a perspective view of another coupler apparatus as a comparative example of the coupler apparatus according to the fifth embodiment;

FIG. 28 is a view showing frequency characteristics of a transmission coefficient (S21) in each of the four states depicted in FIG. 27 in case of the coupler apparatus shown in FIG. 26;

FIG. 29 is a view showing frequency characteristics of a transmission coefficient (S21) in each of the four states depicted in FIG. 27 in case of the coupler apparatus show in FIG. 23 and FIG. 24;

DETAILED DESCRIPTION

Various embodiments will be described hereinafter with reference to the accompanying drawings.

In general, according to the one embodiment, a coupler apparatus includes a coupling element and a ground plane. The coupling element is formed of a conductive material. The coupling element is subjected to power feeding to a reference point. The ground plane is formed of a conductive material. The ground plane faces the coupling element. The ground plane has a notch at a position facing at least a part of a portion of the coupling element except the reference point or near the position.

First Embodiment

Figure 1:
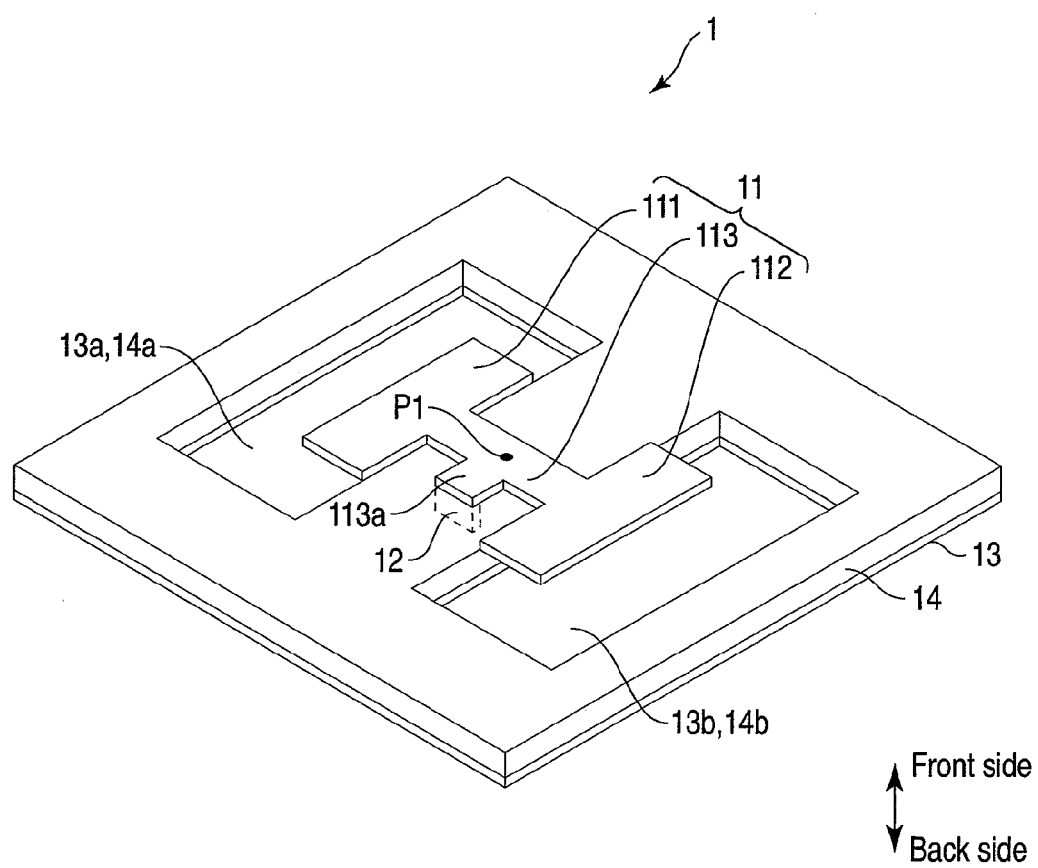
FIG. 1 is a perspective view of a coupler apparatus according to a first embodiment.
Figure 2:
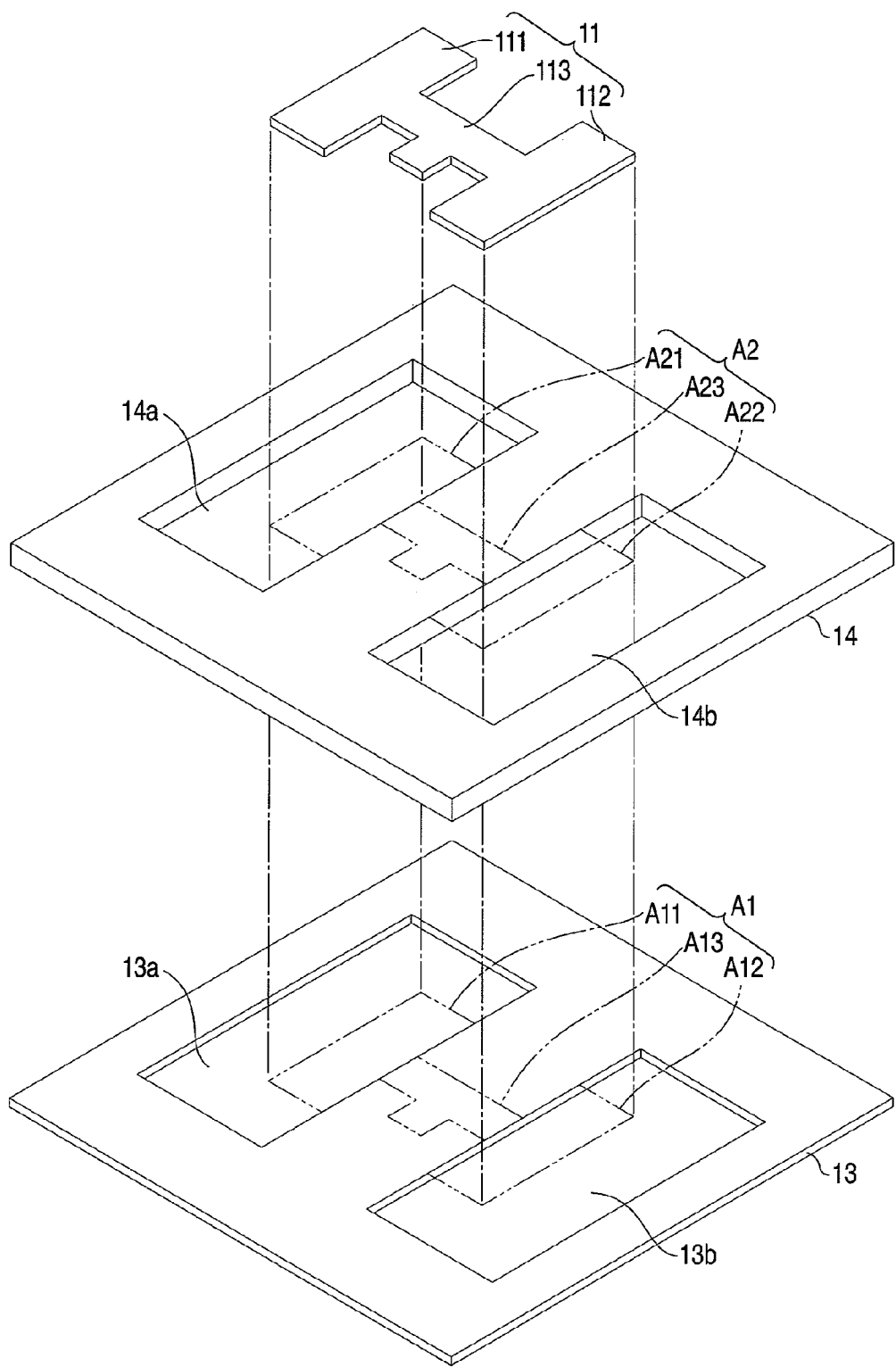
FIG. 2 is an exploded perspective view of the coupler apparatus depicted in FIG. 1.
Figure 3:
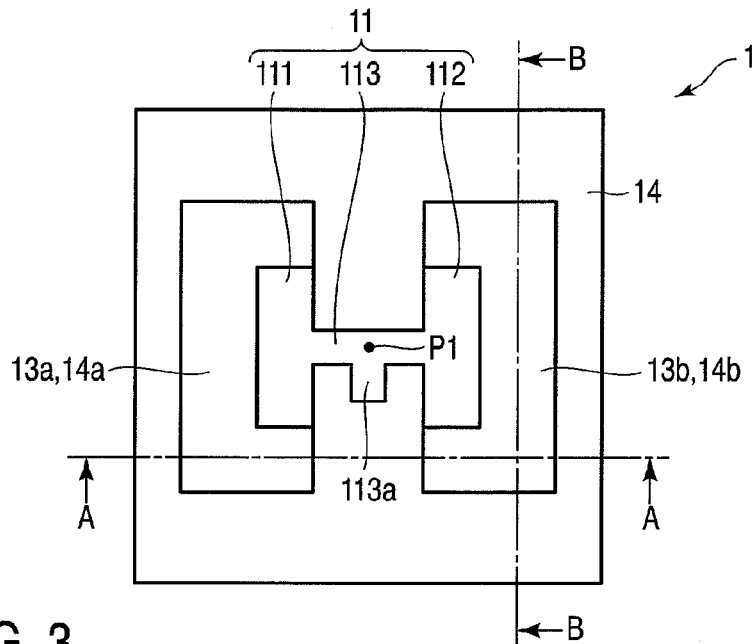
FIG. 3 is a plan view of the coupler apparatus depicted in FIG. 1.
Figure 4:
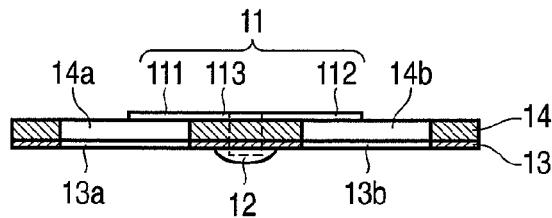
FIG. 4 is a cross-sectional view taken through A-A as indicated by arrowheads in FIG. 2.
Figure 5:
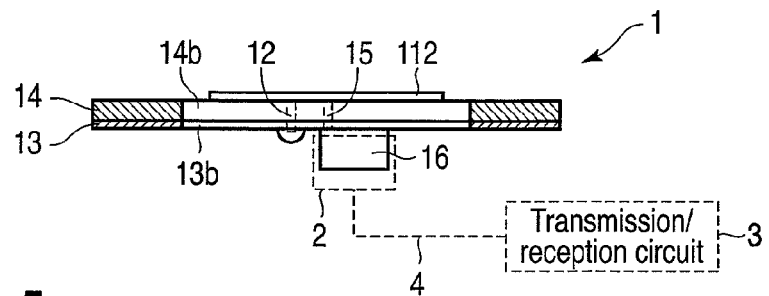
FIG. 5 is a cross-sectional view taken through B-B as indicated by arrowheads in FIG. 2.

FIG. 1 is a perspective view of a coupler apparatus 1 according to a first embodiment. FIG. 2 is an exploded perspective view of the coupler apparatus 1. FIG. 3 is a plan view of the coupler apparatus 1. FIG. 4 is a cross-sectional view taken through A-A as indicated by arrowheads in FIG. 3. FIG. 5 is a cross-sectional view taken through B-B as indicated by arrowheads in FIG. 3.

As shown in FIG. 1 to FIG. 5, the coupler apparatus 1 includes a coupling element 11, a short element 12, a ground plane 13, and a dielectric 14. Further, as shown in FIG. 5, the coupler apparatus 1 further includes a feeder cable 15 and a connector 16. It is to be noted that the feeder cable 15 and the connector 16 are omitted in FIG. 1 to FIG. 4.

Each of the coupling element 11, the ground plane 13, and the dielectric 14 has a tabular shape, and the coupling element, the dielectric 14, and the ground plane 13 are aligned in their thickness directions in the mentioned order with these thickness directions being substantially uniformed. It is to be noted that an alignment direction (a thickness direction/a height direction) of the coupling element 11, the dielectric 14, and the ground plane 13 is determined as a front-and-back direction of the coupler apparatus 1, and the coupling element 11 side is determined as a front side. That is, the coupling element 11 is placed on the front side of the dielectric 14, and the ground plane 13 is placed on the back side of the dielectric 14.

The coupling element 11 is obtained by forming a dielectric material into such a shape as depicted in FIG. 1 to FIG. 5. That is, the coupling element 11 has a tabular shape. Furthermore, the coupling element 11 has the following shape on a plane orthogonal to its thickness direction. That is, in the coupling element 11, two rectangular portions 111 and 112 are present in parallel to be apart from each other. In the coupling element 11, a coupling portion 113, which extends along an alignment direction of the rectangular portions 111 and 112, is present to couple central parts of the rectangular portions 111 and 112 with each other. A convex portion 113a is formed at the center of the coupling portion 113. It is determined that each of the rectangular portions 111 and 112 and the coupling portion 113 has a width that allows a signal that is transmitted or received with respect to another coupling apparatus to be supplied in a substantially entire region.

The short element 12 has a rectangular tabular shape, and its thickness direction is orthogonal to the thickness direction of the coupling element 11. The short element 12 is joined and connected to the coupling portion 113 at an end of the convex portion 113a. The short element 12 may be integrated with or separated from the coupling element 11. The short element 12 is arranged to penetrate through the dielectric 14. The short element 12 is electrically connected with the ground plane 13 by using, e.g., a through hole or soldering.

The ground plane 13 is obtained by forming a thin layer made of a conducive material on a substantially entire surface of the dielectric 14. This ground plane 13 is electrically connected with a metal housing or the like of a communication device in which the coupler apparatus 1 is mounted. Therefore, the ground plane 13 functions as a ground electrode. The ground plane 13 is apart from the coupling element 11 in such a manner that direct conduction (which differs from conduction using the short element 12 interposed between the ground plane 13 and the coupling element 11 cannot be produced. Notch portions 13a and 13b are formed in the ground plane 13.

The dielectric 14 is obtained by forming a dielectric material into a tabular shape. The dielectric 14 is arranged in a gap between the coupling element 11 and the ground plane 13. In the first embodiment, the dielectric 14 has a thickness substantially equal to the gap between the coupling element 11 and the ground plane 13, thereby filling the gap between the coupling element 11 and the ground plane 13. Therefore, a major part of the short element 12 is placed in the dielectric 14. However, the thickness of the dielectric 14 may be smaller than the gap between the coupling element 11 and the ground plane 13. When the thickness of the dielectric 14 is smaller than the gap between the coupling element 11 and the ground plane 13, the dielectric 14 is typically in contact with the ground plane 13, and the dielectric 14 is arranged to be apart from the coupling element 11. However, the dielectric 14 may be arranged in a state where it is in contact with the coupling element 11 and apart from the ground plane 13. Alternatively, the dielectric 14 may be arranged to be apart from both the coupling element 11 and the ground plane 13. Further, a first dielectric that is in contact with the coupling element 11 and a second dielectric that is in contact with the ground plane 13 may be provided, respectively, and the first and second dielectric bodies may be arranged to be apart from each other. Notch portions 14a and 14b are formed in the dielectric 14.

The feeder cable 15 is arranged to penetrate through the ground plane 13 and the dielectric 14. One end of the feeder cable 15 is connected to the coupling element 11, and the other end of the same is connected with the connector 16. The feeder cable 15 is insulated from the ground plane 13.

The connector 16 is arranged to face the ground plane 13 and fixed to the dielectric 14. In a state where the coupler apparatus 1 is mounted in a communication device, a connector 2 is coupled with this connector 16. The connector 2 is connected with a transmission/reception circuit 3 mounted in the communication device through a cable 4. Moreover, the connector 16 and the connector 2 electrically connect the feeder cable 15 to the cable 4.

It is to be noted that the coupler apparatus 1 feeds power to a feeding point P1 through the connector 16 provided on the ground plane 13 side in the example shown in FIG. 1 to FIG. 5, but a feeding method and an implementing method are not restricted thereto. For example, the coupler apparatus 1 can be implanted as a substrate that is integral with the transmission/reception circuit 3 in such a manner that the power can be fed to the feeding point P1 on the coupling element 11 side as a pattern of this substrate.

The notches 13a and 13b are formed to be pierced in the ground plane 13 in the front-and-back direction. Positions and shapes of the notches 13a and 13b are determined to meet the following conditions.

(1) The notches 13a and 13b are not aligned in the front-and-back direction with respect to a portion of the coupling element 11 that serves as a point (which will be referred to as the feeding point hereinafter) P1 to which the feeder cable 15 is connected. That is, the notches 13a and 13b do not include a region of the coupling element 11 that faces the feeding point P1.

(2) The notches 13a and 13b are aligned in the front-and-back direction near a part of a portion of the coupling element 11 in which a current contributing to the electromagnetic coupling is generated. That is, the notches 13a and 13b are present near a region of the ground plane 13 facing at least a part of the coupling element 11.

Specifically, the notch 13a is aligned in the front-and-back direction with respect to the entire rectangular portion 111, and the notch 13b is aligned in the front-and-back direction with respect to the entire rectangular portion 112. That is, the notch 13a is present in a region facing the rectangular portion 111, and the notch 13b is present in a region facing the rectangular portion 112. Therefore, a projection region (a region facing the coupling element 11) when the coupling element 11 is projected to the front-side surface of the ground plane 13 in the front-and-back direction is a region A indicated by an alternate long and two short dashes line in FIG. 2. It can be understood from FIG. 2 that, since regions A11 and A12 associated with the rectangular portions 111 and 112 in the region A1 overlap the notches 13a and 13b, the notches 13a and 13b are provided to face all of the rectangular portions 111 and 112, i.e., the notches 13a and 13b are provided near a region A13 (regions adjacent to each other). Further, it can be also understood that, since the region A13 associated with the coupling portion 113 in the region A1 does not overlap both the notches 13a and 13b, the notches 13a and 13b do not face the coupling portion 113 including the feeding point P1.

The notches 14a and 14b are formed penetrating through the dielectric 14 in the front-and-back direction. The notches 14a and 14b are aligned in the front-and-back direction near a part of a portion in the coupling element 11 where a current contributing to the electromagnetic coupling is generated. That is, the notches 14a and 14b are present near a region in the dielectric 14 facing at least a part of the coupling element 11.

Specifically, the notch 14a is aligned in the front-and-back direction with respect to the entire rectangular portion 111, and the notch 14b is aligned in the front-and-back direction with respect to the entire rectangular portion 112. Furthermore, the notch 14a and the notch 13a have the same position and the same shape in a plane orthogonal to the front-and-back direction, or the notch 14b and the notch 13b have the same. That is, the notch 14a is present in a region facing the rectangular portion 111 and the notch 13a, and the notch 13b is present in a region facing the rectangular portion 112 and the notch 13b. Therefore, a projection region (a region facing the coupling element 11) when the coupling element 11 is projected in the front-and-back direction with respect to the front surface side of the dielectric 14 is a region A2 indicated by an alternate long and two short dashes line in FIG. 2. It can be understood from FIG. 2 that, since the regions A21 and A22 associated with the rectangular portions 111 and 112 in the region A2 overlap the notches 14a and 14b, the notches 14a and 14b are provided to face all of the rectangular portions 111 and 112, i.e., the notches 14a and 14b are provided near the region A22 (adjoining regions). Moreover, it can be also understood that, since a region A23 associated with the coupling portion 114 in the region A2 do not overlap both the notches 14a and 14b, the notches 14a and 14b do not face the coupling portion 113 including the feeding point P1.

In the first embodiment, the pair of notches 13a and 14a and the pair of notches 13b and 14b can be fabricated by simultaneously cutting out parts of the ground plane 13 and the dielectric 14 in a state where the ground plane 13 and the dielectric 14 overlap each other.

FIG. 6 is a perspective view showing an appearance of an information processing apparatus 30 as an example of a device on which the coupler apparatus 1 is mounted. This information processing apparatus 30 is realized as, e.g., a notebook type portable personal computer that can be driven by a battery.

The information processing apparatus 30 includes a main body 300 and a display unit 350. The display unit 350 is supported by the main body 300 to allow its swiveling motion. The display unit 350 can form an opened state where an upper surface of the main body 300 is exposed and a closed state where the upper surface of the main body 300 is covered. In the display unit 350, a liquid crystal display (LCD) 351 is provided.

The main body 300 has a thin box-like housing. A keyboard 301, a touch pad 302, and a power switch 303 are arranged in the main body. Part of the keyboard 301, part of the touch pad 302, and part of the power switch 303 are exposed to the outside of the housing from an upper surface of the housing. Furthermore, in the main body 300, the coupler apparatus 1 is provided in the housing. A direction of the coupler apparatus 1 in the main body 300 may be arbitrary. However, the front-and-back direction in FIG. 1 is typically set to coincide with a direction orthogonal to the upper surface of the housing of the main body 300. Moreover, the coupling element 11 rather than the ground plane 13 is typically placed near the upper surface of the housing of the main body 300.

The coupler apparatus 1 is utilized to perform proximity wireless communication between the information processing apparatus 30 and the other non-illustrated apparatus. The proximity wireless communication is executed in a peer-to-peer system. A communication enabled range is, e.g., approximately 3 cm. Wireless connection between communication terminals is achieved when a distance between the coupler apparatuses 1 mounted in the respective communication terminals becomes equal to or below the communication enabled range. When the distance between the two coupler apparatuses 1 becomes equal to or below the communication enabled range, the wireless communication between the two communication terminals is achieved. Furthermore, data such as a data file specified by a user or a predetermined synchronization target data file is transmitted or received between the two communication terminals.

In the example depicted in FIG. 6, the coupler apparatus 1 is arranged below a region that functions as a palm rest on the upper surface of the main body 300. Therefore, a part of the palm rest functions as a communication surface. When the other communication terminal that is to perform the proximity wireless communication with the information processing apparatus 30 is moved closer to the palm rest, the wireless connection between this communication terminal and the information processing apparatus 30 can be achieved.

Figure 7:
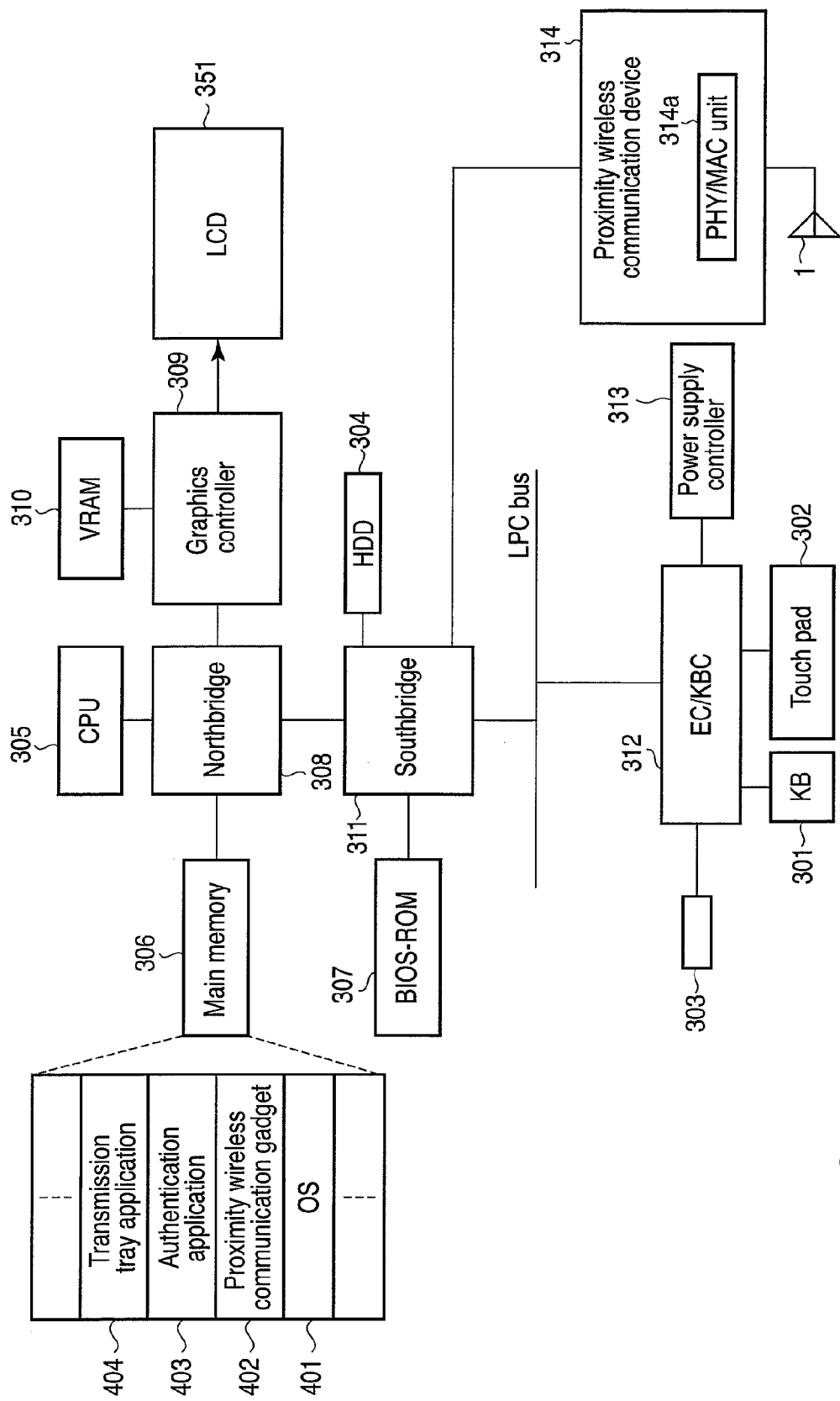
FIG. 7 is a block diagram of the information processing apparatus depicted in FIG. 6.

FIG. 7 is a block diagram of the information processing apparatus 30. It is to be noted that like reference numerals denote parts equal to those in FIG. 6.

The information processing apparatus 30 includes the coupler apparatus 1, the keyboard 301, the touch pad 302, the power switch 303, and the LCD 351, and this apparatus also includes a hard disk drive (HDD) 304, a CPU 305, a main memory 306, a basic input/output system-ROM (BIOS-ROM) 307, a northbridge 308, a graphics controller 309, a video memory (VRAM) 310, a southbridge 311, an embedded controller/keyboard controller IC (EC/KBC) 312, a power supply controller 313, and a proximity wireless communication device 314.

The hard disk drive 304 stores codes required to execute an operating system (OS) or various kinds of programs such as an BIOS update program.

The CPU 305 executes various kinds of programs loaded to the main memory 306 from the hard disk drive 304 in order to control operations of the information processing apparatus 30. Programs executed by the CPU 305 include an operating system 401, a proximity wireless communication gadget application program 402, an authentication application program 403, or a transmission tray application program 404.

Additionally, the CPU 305 executes a BIOS program stored in the BIOS-ROM 307 to control hardware.

The northbridge 308 connects a local bus of the CPU 305 and the southbridge 311. The northbridge 308 has a built-in memory controller that controls access of the main memory 306. Further, the northbridge 308 has a function of executing communication with the graphics controller 309 via an AGP bus and the like.

The graphics controller 309 controls the LCD 351. The graphics controller 309 generates a video signal representing a display image that is displayed in the LCD 351 from display data stored in the video memory 310. It is to be noted that the display data is written into the video memory 310 under control of the CPU 305.

The southbridge 311 controls devices on an LPC bus. The southbridge 311 has a built-in ATA controller configured to control the hard disk drive 304. Furthermore, the southbridge 311 has a function of controlling access of the BIOS-ROM 307.

The embedded controller/keyboard controller IC (EC/KBC) 312 is a one-chip microcomputer in which an embedded controller and a keyboard controller are integrated. The embedded controller controls a power supply controller to turn on/off the information processing apparatus 30 in accordance with operations of the power switch 303 by a user. The keyboard controller controls the keyboard 301 and the touch pad 302.

The power supply controller 313 controls operations of a non-illustrated power supply apparatus. It is to be noted that the power supply apparatus generates operation power for each unit in the information processing apparatus 30.

The proximity wireless communication device 314 includes a PHY/MAC unit 314a. The PHY/MAC unit 314a operates under control of the CPU 305. The PHY/MAC unit 314a communicates with the other communication terminal through the coupler apparatus 1. This proximity wireless communication device 314 corresponds to the transmission/reception circuit 3 in FIG. 2. The proximity wireless communication device 314 is accommodated in a case of the main body 300.

It is to be noted that a peripheral component interconnect (PCI) bus is utilized for data transfer between the proximity wireless communication device 314 and the southbridge 311. It is to be noted that a PCI Express may be used in place of the PCI.

An operation of the thus-configured coupler apparatus 1 will now be explained.

Figure 8:
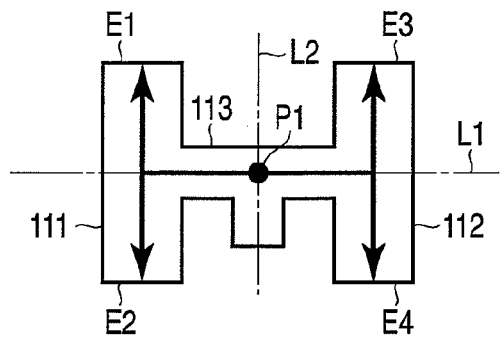
FIG. 8 is a view showing a current path in a coupling element in FIG. 1.

As shown in FIG. 5, when a signal is transmitted from the transmission/reception circuit 3 connected with the coupler apparatus 1, this signal is supplied to the feeding point P1 of the coupling element 1 through the cable 4, the connector 2, the connector 16, and the feeder cable 15. Then, an electric current associated with the signal is produced in the coupling element 11. Current paths in the coupling element 11 at this moment are as indicated by a heavy line in FIG. 8.

That is, two current paths leading to the rectangular portions 111 and 112 from the feeding point P1 along the coupling portion 113 are produced, respectively. In the coupling portion 113, the electric current is generated in its substantially entire region. Therefore, it can be considered that the current path in the coupling portion 113 runs through the central part of the coupling portion 113.

In the rectangular portions 111 and 112, the electric current is generated in their substantially entire regions. Therefore, it can be considered that the current path in the rectangular portion 111 runs through a central part of the rectangular portion 111 or 112. Therefore, the current path is divided into two paths at the center of the rectangular portion 111 to reach end portions E1 and E2 of the rectangular portion 111. In the rectangular portion 112, likewise, the current path is divided into two paths at the center of the rectangular portion 112 to reach end portions E3 and E4 of the rectangular portion 112.

In this manner, the four current paths reaching the end portions E1, E2, E3, and E4 from the feeding point P1 are formed in this manner. Therefore, each of the end portions E1, E2, E3, and E4 becomes as an open end. Further, each of the four current paths also partially functions as the other current paths. That is, as the current path leading to the rectangular portion 111 in the coupling portion 113, the two current paths leading to the end portion E1 and the end portion E2 are used in common. As the current path leading to the rectangular portion 112 in the coupling portion 113, the two current paths leading to the end portion E3 and the end portion E4 are used in common.

Meanwhile, a size of the coupling element 11 is determined to meet the following conditions (1) to (3).

(1) A length of each of the four current paths substantially corresponds to ¼ of a wavelength λ of a central frequency of the signal.

(2) The pair of the end portion E1 and the end portion E2 or the pair of the end portion E3 and the end portion 4 are placed at substantially symmetrical positions with a straight line L1 being determined as a symmetric axis.

(3) The pair of the end portion E1 and the end portion E3 or the pair of the end portion E2 and the end portion E4 are placed at substantially symmetrical positions with a straight line L2 being determined as a symmetric axis.

However, both the straight lines L1 and L2 run through the feeding point P1 and orthogonal to each other.

Therefore, the respective four current paths include portions facing the two directions substantially orthogonal to each other. When the four current paths leading to the end portions E1, E2, E3, and E4 from the feeding point P1 are called first, second, third, and fourth current paths, respectively, a pair of the first and the third current path or a pair of the second and the four current path are substantially symmetrical with respect to the straight line L1. Moreover, a pair of the first and the second current path or a pair of the third and the four current path are substantially symmetrical with respect to the straight line L2.

Therefore, at least two of the four current paths are parallel to the same direction (which will be referred to as a first direction hereinafter) and include parts opposite to each other. Additionally, at least two of the four current paths are parallel to a direction substantially orthogonal to the first direction (which will be referred to as a second direction hereinafter) and include parts opposite to each other. It is to be noted that the first direction is a direction parallel to the line L1 and the second direction is a direction parallel to the line L2 in this embodiment, but it is not essential.

An electromagnetic wave is produced around the first coupler apparatus 1 by the current generated in the coupling element 11 of the first coupler apparatus 1. Further, a current is induced in the coupling element 11 of the second coupler apparatus 1 by the electromagnetic wave. In this manner, the signal is transmitted/received between the two coupler apparatuses 1.

Meanwhile, in the above-described use state, the ground plane 13 is grounded, and the coupling element 11 is close to the ground plane 13, whereby energy from the coupling element 11 is partially leaked to the ground plane 13. However, in the coupler apparatus 1, since the notches 13a and 13b are formed, the ground plane 13 is not aligned in the front-and-back direction with respect to the rectangular portions 111 and 112. Therefore, as compared with an example where the notches 13a and 13b are not formed, a distance between the current path and the ground plane 13 is large in each of the rectangular portions 111 and 112, and an amount of energy that leaks to the ground plane 13 from the coupling element 11 is reduced. Further, since the notches 14a and 14b are formed, when the dielectric 14 is arranged between the ground plane 13 and the coupling element 11, an electric field between the ground plane 13 and the coupling element 11 is concentrated on a portion where the dielectric 14 is sandwiched, and energy emitted from the dielectric 14 is attracted to the ground plane 13 side. Thus, providing the notches 14a and 14b in the dielectric 14 can avoid the concentration of the electric field between the ground plane 13 and the coupling element 11. Further, as a result of this operation, an energy amount utilized for the electromagnetic coupling with respect to the coupler apparatus as an intended party of communication increases, thereby improving the transmission coefficient (S21).

In particular, with regard to the periphery of the coupling element 11, enlarging areas of the notches 13a, 13b, 14a, and 14b enables improving the transmission coefficient (S21) with respect to the coupler apparatus as the intended party of communication.

It is to be noted that the ground plane 13 is notched at positions (positions aligned in the front-and-back direction) facing a part of a portion in the coupling element 11 where the current contributing to the electromagnetic coupling is generated. However, when an area of the entire ground plane 13 is large, performance of the coupler apparatus 1 is improved, the energy amount utilized for the electromagnetic coupling with respect to the coupler apparatus as the intended party of communication can be improved. Further, when, e.g., a metal housing, an electric substrate, or a member subjected metallic coating is arranged at positions of a lower portion (an opposite side of the coupling element 11) of the ground plane 13 facing the coupling element 11, the grounding characteristics can be further improved.

Second and subsequent embodiments are similar to the foregoing embodiment in that the characteristics of the coupler apparatus 1 can be improved when each notch near such a coupling element 11 has a larger area and in that the characteristics of the coupler apparatus 1 can be improved when the ground plane has a larger area.

Figure 9:
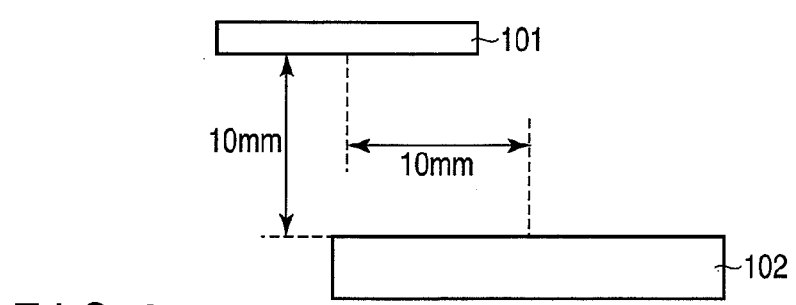
FIG. 9 is a view showing measurement conditions for a transmission coefficient.
Figure 10:
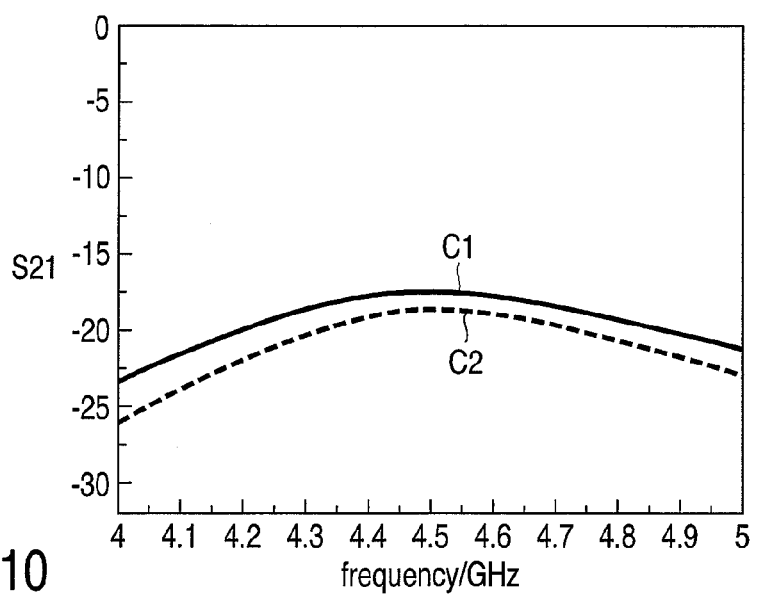
FIG. 10 is a view showing a relationship between a frequency and a transmission coefficient (S21) in the coupler apparatus according to the first embodiment.

FIG. 10 shows a relationship between a frequency and a transmission coefficient (S21) under conditions that a test coupler 101 faces a reference coupler 102 of TransferJET in a state depicted in FIG. 9.

Although not shown in FIG. 9, a coupling element included in the test coupler 101 faces a coupling element included in the reference coupler 102. Further, centers of both the coupling elements have a positional relationship shown in FIG. 9.

In FIG. 10, a curved line C1 indicates characteristics obtained when the test coupler 101 is the coupler apparatus 1, and a curved line C2 indicates characteristics obtained when the test coupler 101 is a coupler apparatus having a structure that the notches 13a, 13b, 14a, and 14b in the coupler apparatus 1 are not formed.

It is obvious from FIG. 10 that presence of the notches 13a, 13b, 14a, and 14b enables improving the transmission coefficient in all frequencies in a necessary frequency band. It is to be noted that a difference between transmission coefficients at a central frequency of the necessary frequency band is approximately 1 dB.

Second Embodiment

FIG. 11 is a perspective view of a coupler apparatus 5 according to a second embodiment. FIG. 12 is an exploded perspective view of the coupler apparatus 5 depicted in FIG. 11. It is to be noted that like reference numerals denote parts equal to those in FIG. 1, thereby omitting a detailed explanation thereof.

As shown in FIG. 11, the coupler apparatus 5 includes a coupling element 11, a short element 12, a ground plane 13, and a dielectric 51. Further, the coupler apparatus 5 further includes such a feeder cable 15 and a connector 16 as depicted in FIG. 5, the feeder cable 15 and the connector 16 are omitted in FIG. 11.

That is, the coupler apparatus 5 includes a dielectric 51 in place the dielectric 14 in the coupler apparatus 1.

Although the dielectric 51 is obtained by forming a dielectric material into a tabular shape like the dielectric 14, a point that the notches 14a and 14b are not formed is different from the dielectric 14. The dielectric 51 is arranged like the dielectric 14. Therefore, a projection region (a region facing the coupling element 11) when the coupling element 11 is projected in the front-and-back direction with respect to the front-side surface of the dielectric 51 is a region A3 indicated by an alternate long and short dashes line in FIG. 12.

Even in such a coupler apparatus 5, since the notches 13a and 13b are formed, the ground plane 13 is not aligned in the front-and-back direction with respect to rectangular portions 111 and 112. Therefore, as compared with an example where the notches 13a and 13b are not formed, a distance between the current path and the ground plane 13 is large in each of the rectangular portions 111 and 112, and an amount of energy that leaks to the ground plane 13 from the coupling element 11 is reduced. Further, as a result of this operation, an energy amount utilized for the electromagnetic coupling increases, so that the performance of the coupling is improved.

FIG. 13 shows a relationship between a frequency and a transmission coefficient (S21) under conditions depicted in FIG. 9.

In FIG. 13, a curved line C3 indicates characteristics obtained when a test coupler 101 is the coupler apparatus 5, and a curved line C4 indicates characteristics obtained when the test coupler 101 is a coupler apparatus having a structure that the notches 13a and 13b in the coupler apparatus 5 are not formed.

It is obvious from FIG. 13 that presence of the notches 13a and 13b enables improving the transmission coefficient in all frequencies in a necessary frequency band. It is to be noted that a difference between transmission coefficients at a central frequency of the necessary frequency band is approximately 4.6 dB.

Third Embodiment

FIG. 14 is a perspective view of a coupler apparatus 6 according to a third embodiment. FIG. 15 is an exploded perspective view of the coupler apparatus 6 depicted in FIG. 14. Like reference numerals denote parts equal to those in FIG. 1, thereby omitting a detailed description thereof.

As shown in FIG. 14, the coupler apparatus 6 includes a coupling element 11, a short element 12, and a ground plane 13. Furthermore, the coupler apparatus 6 also includes such a feeder cable 15 and a connector 16 as depicted in FIG. 5, but the feeder cable 15 and the connector 16 are omitted in FIG. 14.

That is, the coupler apparatus 6 does not have the dielectric 14 in the coupler apparatus 1. Other structures of the coupler apparatus 6 are equal to those in the coupler apparatus 6.

Even in such a coupler apparatus 6, since notches 13a and 13b are formed, the ground plane 13 is not aligned in the front-and-back direction with respect to rectangular portions 111 and 112. Therefore, as compared with an example where the notches 13a and 13b are not formed, a distance between the current path and the ground plane 13 is large in each of the rectangular portions 111 and 112, and an amount of energy that leaks to the ground plane 13 from the coupling element 11 is reduced. Further, as a result of this operation, an energy amount utilized for the electromagnetic coupling increases, so that the performance of the coupling is improved.

FIG. 16 shows a relationship between a frequency and a transmission coefficient (S21) under conditions depicted in FIG. 9.

In FIG. 16, a curved line C5 indicates characteristics obtained when a test coupler 101 is the coupler apparatus 6, and a curved line C6 indicates characteristics obtained when the test coupler 101 is a coupler apparatus having a structure that the notches 13a and 13b in the coupler apparatus 6 are not formed.

It is obvious from FIG. 16 that presence of the notches 13a and 13b enables improving the transmission coefficient in a frequency near a central frequency in a necessary frequency band. It is to be noted that a difference between transmission coefficients at the central frequency in the necessary frequency band is approximately 1.5 dB.

Fourth Embodiment

FIG. 17 is a perspective view of a coupler apparatus 7 according to a fourth embodiment. FIG. 18 is an exploded perspective view of the coupler apparatus 7 depicted in FIG. 17. It is to be noted that like reference numerals denote parts equal to those in FIG. 1, thereby omitting a detailed explanation thereof.

As shown in FIG. 17, the coupler apparatus 7 includes a coupling element 11, a short element 12, a ground plane 71, and a dielectric 72. Moreover, the coupler apparatus 7 further includes such a feeder cable 15 and a connector 16 as depicted in FIG. 5, but the feeder cable 15 and the connector 16 are omitted in FIG. 17.

That is, the coupler apparatus 7 includes a ground plane 71 and a dielectric 72 in place of the ground plane 13 and the dielectric 14 in the coupler apparatus 1.

The ground plane 71 and the dielectric 72 are basically arranged and function like the ground plane 13 and the dielectric 14. The ground plane 71 and the dielectric 72 are different from the ground plane 13 and the dielectric 14 in shapes and positions of notches.

Notch portions 71a and 71b are formed in the ground plane 71, and notches 72a and 72b are formed in the dielectric 72, respectively.

The notches 71a and 71b are formed to penetrate through the ground plane 71 in a front-and-back direction. A shape of each of the notches 71a and 71b on a plane orthogonal to the front-and-back direction is a C-like shape. The notch 71a is aligned in the front-and-back direction with respect to a peripheral part of a rectangular portion 111, and the notch 71b is aligned in a front-and-back direction with respect to a peripheral part of a rectangular portion 112. The notches 71a and 71b are not aligned in the front-and-back direction with respect to the rectangular portion 111 and 112. Therefore, a projection region (a region facing the coupling element 11) when the coupling element 11 is projected to the front-side surface of the ground plane 13 in the front-and-back direction is a region A4 indicated by an alternate long and two short dashes line in FIG. 18.

The notches 72a and 72b are formed to penetrate through the dielectric 72 in a front-and-back direction. A pair of the notch 72a and the notch 71a or a pair of the notch 72b and the notch 71b have the same position and the same shape in a plane orthogonal to the front-and-back direction. Therefore, a projection region (a region facing the coupling element 11) when the coupling element 11 is projected to the front-side surface of the dielectric 72 in the front-and-back direction is a region A5 indicated by an alternate long and two short dashes line in FIG. 18.

As described above, the notches 71a, 71b, 72a, and 72b are present to rim the regions of the ground plane 71 and the dielectric 72 facing the rectangular portions 111 and 112. The notches 71a and 71b are provided in regions (adjoining regions) near the region A4, and the notch 72a and 72b are provided in regions (adjoining regions) near the region A5.

Even in such a coupler apparatus 7, an area of the ground plane 71 near a part of the rectangular portions 111 and 112 is smaller than that in an example where the notches 71a and 71b are not formed, and an amount of leaking energy from the coupling element 11 to the ground plane 13 is reduced. Further, when the dielectric 72 is arranged between the ground plane 71 and the coupling element 11, an electric field between the ground plane 71 and the coupling element 11 is concentrated on a portion where the dielectric 72 is sandwiched, and energy emitted from the dielectric 72 is attracted to the ground plane 71. Thus, the notches 72a and 72b in the electric body 72 can avoid concentration of the electric field between the ground plane 71 and the coupling element 11. So that, an energy amount utilized for the electromagnetic coupling with respect to the coupler apparatus as an intended party of communication increases, thereby improving the transmission coefficient (S21).

Figure 19:
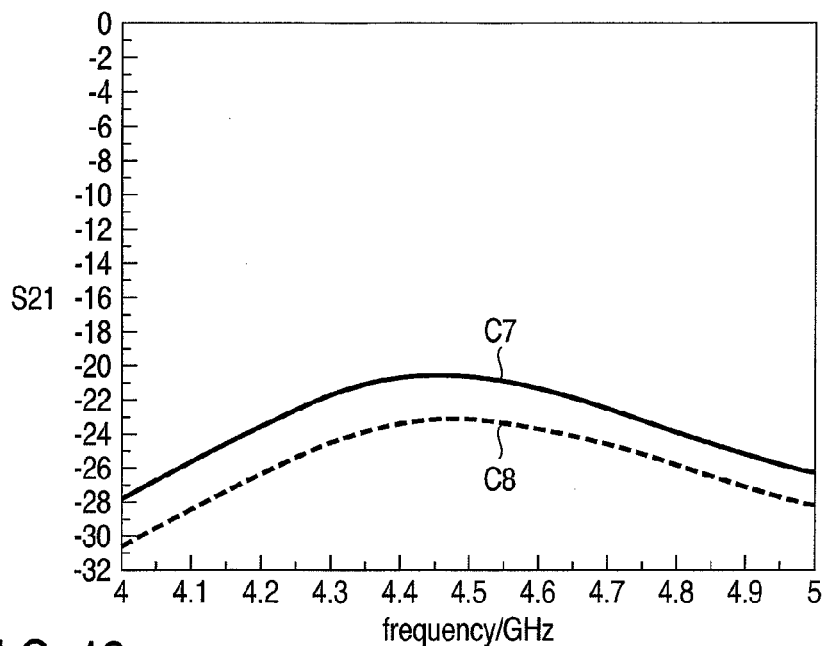
FIG. 19 is a view showing a relationship between a frequency and a transmission coefficient (S21) in the coupler apparatus according to the fourth embodiment.

FIG. 19 shows a relationship between a frequency and a transmission coefficient (S21) under conditions depicted in FIG. 9.

In FIG. 19, a curved line C7 indicates characteristics obtained when a test coupler 101 is the coupler apparatus 7, and a curved line C8 indicates characteristics obtained when the test coupler 101 is a coupler apparatus having a structure that the notches 71a, 71b, 72a, and 72b in the coupler apparatus 7 are not formed.

It is obvious from FIG. 19 that presence of the notches 71a, 71b, 72a, and 72b enables improving the transmission coefficient in all frequencies in a necessary frequency band. It is to be noted that a difference between transmission coefficients at a central frequency in the necessary frequency band is approximately 3 dB.

The foregoing embodiments can be modified in many ways as follows.

The coupling element may have an arbitrary shape. For example, the coupling element may be an element having a different known shape, e.g., a coupling element in a reference coupler of TransferJET or a reversed F type coupling element. Alternatively, it may be a coupling element suggested as JP-A 2009-270598 (KOKAI) by the present applicant.

Figure 20:
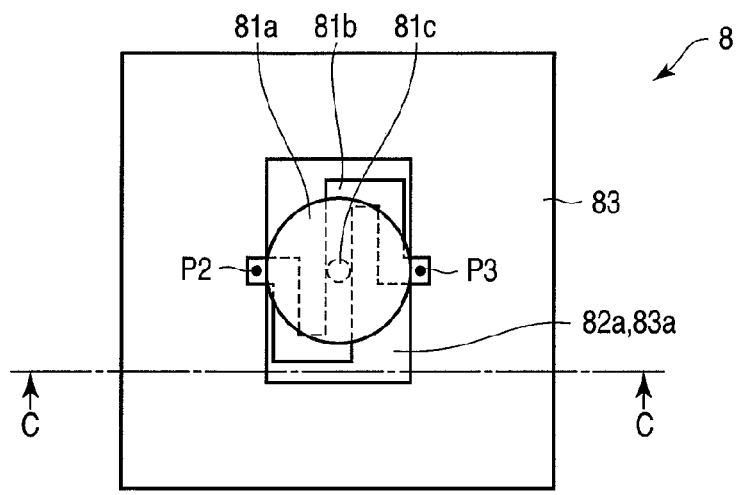
FIG. 20 is a plan view of a coupler apparatus according to a modification.
Figure 21:
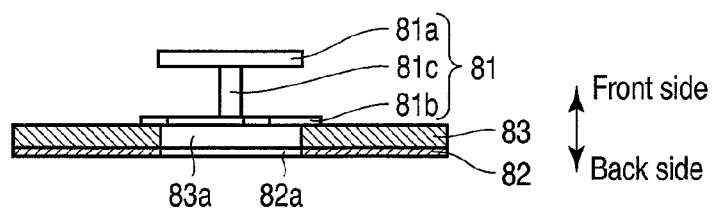
FIG. 21 is a cross-sectional view taken through C-C as indicated by the arrowheads in FIG. 20.

FIG. 20 is a plan view of a coupler apparatus 8 according to a modification. FIG. 21 is a cross-sectional view taken though C-C as indicated by arrowheads in FIG. 20.

This coupler apparatus 8 includes a coupling element 81, a ground plane 82, and a dielectric 83.

This coupling element 81 further includes a circular plate 81a, a resonant stab 81b, and a connection portion 81c. The circular plate 81a is obtained by forming a conductive material into a thin circular plate. The resonant stab 81b is obtained by forming a thin conductive material. A shape of the resonant stab 81b is a crank shape as depicted in FIG. 20. The connection portion 81c is obtained by a columnar conductive material. One end of the coupling portion 81c is joined and connected to a center of the circular plate 81a, and the other end of the same is joined and connected to the center of the resonant stab 81b. Both ends of the resonant stab 81b are fixed to the dielectric 83. The resonant stab 81b is connected to a transmission/reception circuit (not shown) at a point P2 near the one end thereof and also connected to the ground plane 82 at a point P3 near the other end thereof.

The ground plane 82 is obtained by forming a thin plate consisting of a conductive material on a substantially entire surface of the dielectric 83. The dielectric 83 is a plate-like shape. A notch 82a formed in the ground plane 82. A notch 83a formed in the dielectric 83. The notches 82a and 83a are substantially the same shapes to each other. The notches 82a and 83a are faced each other. The notches 82a and 83a are aligned in a front-and-back direction with respect to at least a part of a portion other than the end portions of the resonant stab 81b including the points P2 and P3. It is to be noted that the notches 82a and 83a are aligned in the front-and-back direction with respect to an entire portion of the resonant stab 81b other than the end portions including the points P2 and P3 in the example depicted in FIG. 20.

In this coupler apparatus 8, when power is fed to the point P2 from the transmission/reception circuit, a current path reaching the circular plate 81a through the resonant stab 81b and the connection portion 81c is generated. However, since the notch 82a is formed, a distance between the current path of the resonant stab 81b and the ground plane 82 is larger than that in an example where the notch 82a is not formed, and an amount of leaking energy from the coupling element 81 to the ground plane 82 is reduced. Further, when the dielectric 83 is arranged between the ground plane 82 and the coupling element 81b, an electric field between the ground plane 82 and the coupling element 81b is concentrated onto a portion where the dielectric 83 is sandwiched, and energy emitted from the dielectric 83 is attracted to the ground plane 82 side. Thus, providing the notches 83a and 83b in the dielectric 83 enables avoiding concentration of the electric field between the ground plane 82 and the coupling element 81b, whereby an amount of energy utilized for electromagnetic coupling with respect to a coupler apparatus as an intended party of communication is increased and a transmission coefficient (S21) is improved.

FIG. 22 shows a relationship between a frequency and the transmission coefficient (S21) under conditions depicted in FIG. 9.

In FIG. 22, a curved line C9 indicates characteristics obtained when a test coupler 101 is the coupler apparatus 8, and a curved line C10 indicates characteristics obtained when the test coupler 101 is a coupler apparatus having a configuration that the notches 82a and 83a in the coupler apparatus 8 are not formed.

It is obvious from FIG. 22 that presence of the notches 82a and 83a enables improving the transmission coefficient in all frequencies within a necessary frequency band. It is to be noted that a difference between transmission coefficients at a center of the required frequency is approximately 3.5 dB.

Even in the example where the shape of the coupling element is changed as described above, modifications, e.g., omitting the notch of the dielectric like the second embodiment, omitting the dielectric like the third embodiment, changing the positions of the notches like the fourth embodiment, and others can be combined to be carried out.

Fifth Embodiment

FIG. 23 is a perspective view of a coupler apparatus 9 according to a fifth embodiment. FIG. 24 is an exploded perspective view of the coupler apparatus 9 depicted in FIG. 23.

As shown in FIG. 23 and FIG. 24, the coupler apparatus 9 includes a coupling element 91, short elements 92 and 93, a ground plane 94, and a dielectric 95. It is to be noted that the short elements 92 and 93 are omitted in FIG. 24. Further, the coupler apparatus 9 further includes such a feeder cable 15 and a connector 16 as depicted in FIG. 5, but the feeder cable 15 and the connector 16 are omitted in FIG. 23 and FIG. 24.

Each of the coupling element 91, the ground plane 94, and the dielectric 95 has a tabular shape, and the coupling element 91, the dielectric 95, and the ground plane 94 are aligned in their thickness directions in the mentioned order with these thickness directions being substantially the same.

The coupling element 91 is obtained by forming a dielectric material into a such a shape as depicted in FIGS. 23 and 24. The coupling element 91 has five conductive rectangular portions 91a, 91b, 91c, 91d, and 91e. The conductive portions 91a and 91b are substantially parallel to each other. The conductive portion 91c has both ends which are in contact with intermediate parts of the conductive portions 91a and 91b, respectively. The conductive portions 91d and 91e extend from an intermediate part of the conductive portion 91c in opposite directions.

Each of the short elements 92 and 93 has a rectangular tabular shape, and its thickness direction is orthogonal to a thickness direction of the coupling element 91. The short element 92 is joined and connected to the end of the conductive portion 91d. The short element 93 is joined and connected around the end of the conductive portion 91e. The short elements 92 and 93 may be integrated with or separated from the coupling element 91. The short elements 92 and 93 are arranged to penetrate through the dielectric 95. The short elements 92 and 93 are electrically connected with the ground plane 94 by using a through hole or soldering.

The ground plane 94 is formed the shape in FIG. 23 and FIG. 24. The ground plane 94 has seven rectangular conductive portions 94a, 94b, 94c, 94d, 94e, 94f, and 94g. The conductive portions 94a and 94b are substantially parallel to each other. Both end of the conductive portion 94c are in contact with intermediate parts of the conductive portions 94a and 94b, respectively. The conductive portions 94d and 94e extend from both ends of the conductive portion 94a toward the conductive portion 94b. The conductive portions 94f and 94g extend from both ends of the conducive portion 94b toward the conductive portion 94a. A protruding amount of the conductive portions 94d and 94e from the conductive portion 94a and a protruding amount of the conducive portions 94f and 94g from the conductive portion 94b are set in such a manner that the conductive portion 94d and the conductive portion 94f do not come into contact with the conducive portion 94e and the conducive portion 94f. It is preferable for the protruding amount of the conductive portions 94d and 94e from the conductive portion 94a to be equal to or below a minimum separation width between the conducive portions 91a and 91b and the conductive portion 94a in the horizontal direction. It is preferable for the protruding amount of the conducive portions 94f and 94g from the conductive portion 94b to be equal to or below a minimum separation width of the conductive portions 91a and 91b and the conductive portion 94b in the horizontal direction.

It is to be noted that the protruding amount of the conductive portions 94d and 94e from the conductive portion 94a is equal to or below the minimum separation width between the conductive portions 91a and 91b and the conducive portion 94a in the horizontal direction and the protruding amount of the conductive portions 94f and 94g from the conductive portion 94b is equal to or below the minimum separation width between the conducive portions 91a and 91b and the conductive portion 94b in the horizontal direction in this embodiment, but these structures are in no way restrictive. A current flowing through the conductive portion 91b of the coupling element 91 can be increased as a distance between the conductive portion 94e and the conductive portion 94g of the ground plane 94 is large, and the current flowing through the conductive portion 91b of the coupling element 91 can be reduced as the distance between the conductive portion 94e and the conductive portion 94g is small. That is, adjusting this separation distance enables adjusting a current intensity which should be flowed through the conductive portion 91b.

The dielectric 95 is a tabular shape. The dielectric 95 is arranged in a gap between the coupling element 91 and the ground plane 94. The dielectric 95 has a thickness substantially equal to the gap between the coupling element 91 and the ground plane 94 to fill substantially entire the gap between the coupling element 91 and the ground plane 94. Therefore, greater parts of the short elements 92 and 93 are placed in the dielectric 95. However, the dielectric 95 may be thinner than the gap between the coupling element 91 and the ground plane 94. When the thickness of the dielectric 95 is smaller than the gap between the coupling element 91 and the ground plane 94, the dielectric 95 is typically arranged in such a manner that it is in contact with the ground plane 94 and apart from the coupling element 91. However, the dielectric 95 may be arranged to be in contact with the coupling element 91 and to be apart from the ground plane 94. Alternatively, the dielectric 95 may be arranged to be apart from both the coupling element 91 and the ground plane 94. Further, a first dielectric which is in contact with the coupling element 91 and a second dielectric which is in contact with the ground plane 94 may be provided, respectively, and the first and second dielectric bodies may be arranged to be apart from each other. Although the dielectric 95 may have an arbitrary shape. A shape of the dielectric 95 can cover the entire surface of the coupling element 91 and the entire surface of the ground plane 94 and is arranged in such a state in this example. It is to be noted that a region A6 which indicated by an alternate long and two short dashes line in FIG. 24, represents a projection region when the coupling element 91 is projected in a front-and-back direction with respect to a front-side surface of the ground plane 94. A region A7 represents a projection region when the coupling element 91 is projected in the front-and-back direction with respect to a front-side surface of the dielectric 95.

The coupling element 91 and the ground plane 94 have a relationship that a central part of the conductive portion 91c faces a central part of the conductive portion 94c and a longitudinal direction of the conductive portion 91c crosses a longitudinal direction of the conductive portion 94c. Furthermore, the coupling element 91 and the ground plane 94 have a relationship that the conductive portions 91d and 91e face the conductive portion 94c.

Meanwhile, in the thus configured coupler apparatus 9, when power is fed to a feeding point P4, as shown in FIG. 25, a current I1 flowing through the conductive portion 91c toward the conductive portion 91a, a current I2 flowing through the conductive portion 91c toward the conductive portion 91b, a current I3 flowing toward an end of the conductive portion 91d, and a current I4 flowing toward an end of the conductive portion 91e are generated in the coupling element 91. The conductive portions 91d and 91e are grounded to the ground plane 94 near ends thereof by the short elements 92 and 93, whereas end portions of the conductive portions 91a and 91b are open ends, and hence the current I1 and I2 are smaller than the currents I3 and I4.

Moreover, when the ground plane has a shape whose outline describes a rectangle like the first to fourth embodiments, i.e., when a coupler apparatus 9' having such a ground plane 94' as depicted in FIG. 26 is used, since the ground plane 94' is present near the conductive portions 91a and 91b, electromagnetic energy produced from the currents I1 and I2 abundantly flows to the ground plane 94', and electromagnetic energy contributing to coupling with respect to the other opposed coupler apparatus is reduced.

Consequently, in the coupler apparatus 9', in regard to the electromagnetic coupling between itself and the other opposed coupler apparatus, contribution of the currents I3 and I4 is bigger than contribution of the current I1 and I2. Additionally, as a result of such a phenomenon, in the coupler apparatus 9', a degree of coupling greatly varies in response to a relative direction of the two coupling elements 91 facing each other.

Figure 27:
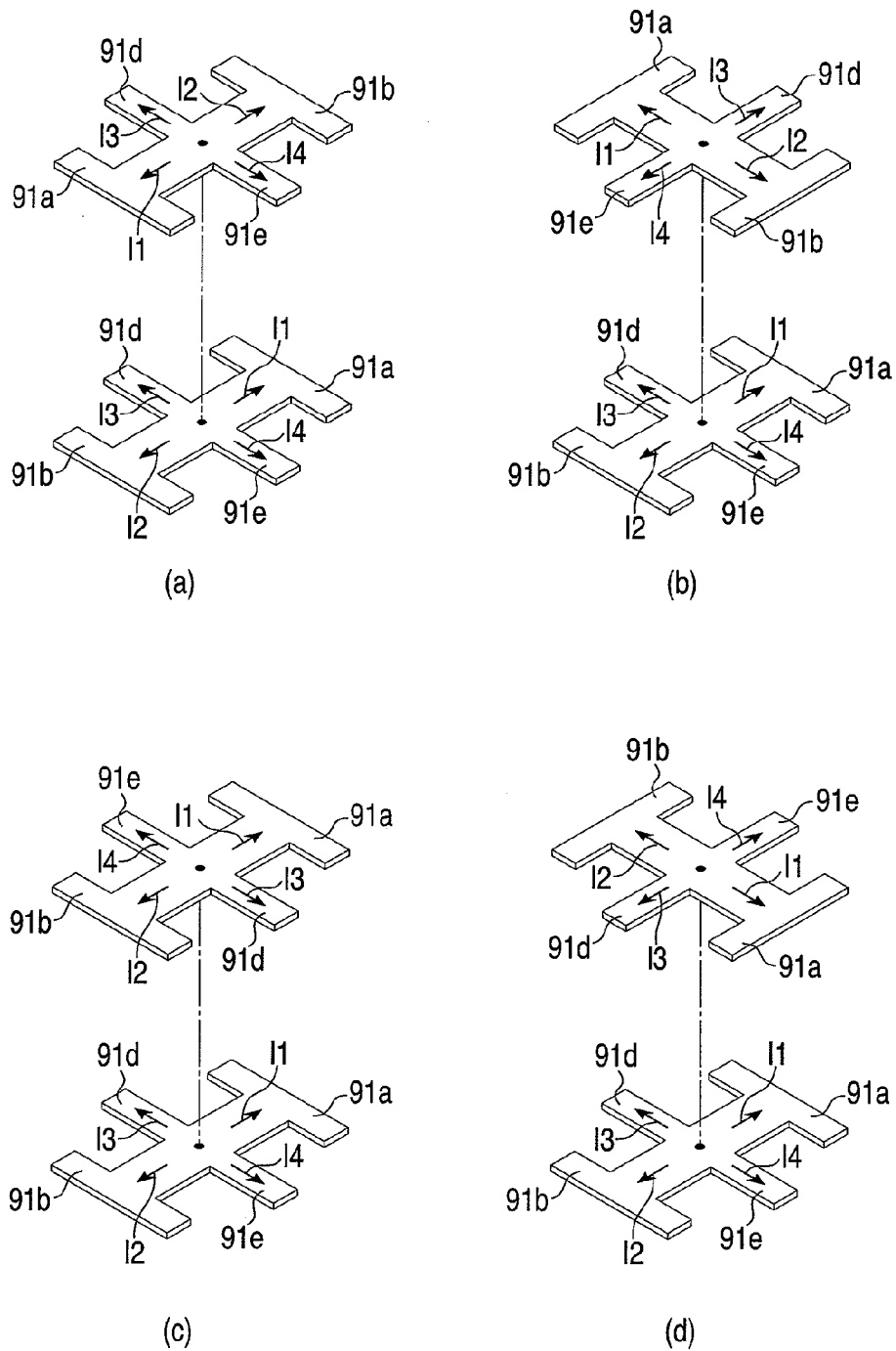
FIG. 27 is a view showing four state examples when the two coupling elements depicted in FIG. 23 and FIG. 24 face each other.

Here, four directions shown in (a) to (d) in FIG. 27 are assumed to be 0 degree, 90 degrees, 180 degrees, and 270 degrees as relative directions of the two coupling elements 91 facing each other.

FIG. 28 is a view showing frequency characteristics of a transmission coefficient (S21) in each of the four states depicted in FIG. 27 in case of the coupler apparatus 9'.

As can be understood from FIG. 28 that, when the coupler apparatus 9' is used, degrees of coupling in case of 90 degrees and 270 degrees are far lower than those in case of 0 degree and 180 degrees. It can be considered that this state occurs since directions of the current I3 and I4 are the same in the two coupling elements 91 in case of 0 degree and 180 degrees, whereas these directions cross each other in case of 90 degrees and 270 degrees. That is, it can be considered that a difference in degree of coupling emerges since strong coupling of the currents I3 and I4 occurs in case of 0 degree and 180 degrees and weak coupling of the currents I1 and I2 and the currents I3 and I4 occurs in case of 90 degrees and 270 degrees.

On the other hand, in the coupler apparatus 9, since the above-descried configuration is adopted, the ground plane 94 is not aligned with the conductive portions 91a and 91b. Therefore, electromagnetic energy produced from the currents I1 and I2 hardly flows through the ground plane 94, and a greater part of this energy functions for electromagnetic coupling with the other coupler apparatus. As a result, a difference between a degree of contribution of the currents I1 and I2 and a degree of contribution of the currents I3 and I4 for the electromagnetic coupling is smaller than that in the coupler apparatus 9'.

FIG. 29 is a view showing frequency characteristics of a transmission coefficient (S21) in each of the four states depicted in FIG. 27 in case of the coupler apparatus 9.

As apparent from comparison between FIG. 29 and FIG. 28, in the coupler apparatus 9, a variation in degree of coupling at the respective angles is smaller than that in the coupler apparatus 9'. As a result, according to the coupler apparatus 9, stable signal transmission can be constantly carried out irrespective of a relative direction of the two coupler apparatuses 9.

It is to be noted that the conductive portions 94d, 94e, 94f, and 94g may be omitted. However, providing the conducive portions 94d, 94e, 94f, and 94g enables increasing an area of the ground plane 94 without changing an external size.

Further, a dielectric 95' shown in FIG. 26 may be provided in place of the dielectric 95. That is, the coupling element 91, the short elements 92 and 93, the ground plane 94, and the dielectric 95' can constitute the coupler apparatus.

Further, a ground plane 94' depicted in FIG. 26 may be provided in place of the ground plane 94. That is, the coupling element 91, the short elements 92 and 93, the ground plane 94', and the dielectric 95 can constitute the coupler apparatus.

Furthermore, the dielectric 95 may be omitted.

Sixth Embodiment

Figure 30:
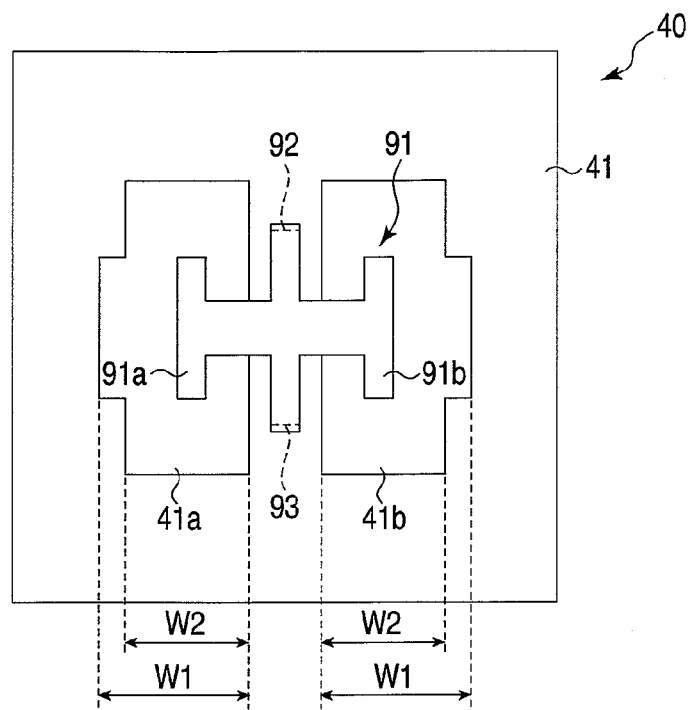
FIG. 30 is a plan view of a coupler apparatus according to a sixth embodiment.

FIG. 30 is a plan view of a coupler apparatus 40 according to a sixth embodiment. It is to be noted that, in FIG. 30, like reference numerals denote parts equal to those in FIG. 23 and FIG. 24, thereby omitting a detailed explanation thereof.

As shown in FIG. 30, the coupler apparatus 40 includes a coupling element 91, short elements 92 and 93, and a ground plane 41. Moreover, although the coupler apparatus 40 includes such a feeder cable 15 and a connector 16 as depicted in FIG. 5, but the feeder cable 15 and the connector 16 are omitted in FIG. 30.

The ground plane 41 is obtained by forming a dielectric material into such a shape as shown in FIG. 30. That is, the ground plane 41 has the following shape on a plane orthogonal to its thickness direction. In the ground plane 41, an opening portion 41a is formed at a position facing a conductive portion 91a of the coupling element 91 and its peripheral region, and an opening portion 41b is formed at a position facing the conductive portion 91b of the coupling element 91 and its peripheral region. Each of the opening portions 41a and 41b has a shape that partially protrudes in such a manner that a width W1 at a position facing the conductive portions 91a and 91b becomes larger than a width W2 at any other position.

In the thus configured coupler apparatus 40, an amount of electromagnetic energy flowing from the conductive portions 91a and 91b to the ground plane 41 can be reduced while assuring an area of the ground plane 41 as much as possible.

Moreover, as a result, substantially the same effect as that in the fifth embodiment can be achieved.

Seventh Embodiment

Figure 31:
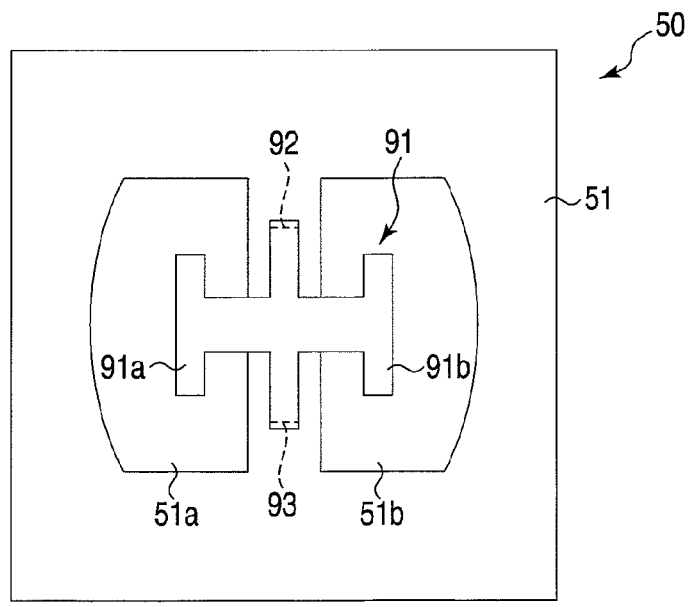
FIG. 31 is a plan view of a coupler apparatus according to a seventh embodiment.

FIG. 31 is a plan view of a coupler apparatus 50 according to a seventh embodiment. It is to be noted that, in FIG. 31, like reference numerals denote parts equal to those in FIG. 23 and FIG. 24 to omit a detailed description thereof.

As shown in FIG. 31, a coupler apparatus 50 includes a coupling element 91, short elements 92 and 93, and a ground plane 51. Additionally, although the coupler apparatus 50 further includes such a feeder cable 15 and a connector 16 as depicted in FIG. 5, the feeder cable 15 and the connector 16 are omitted in FIG. 31.

The ground plane 51 is obtained by forming a dielectric material into such a shape as shown in FIG. 31. That is, the ground plane 51 has the following shape on a plane orthogonal to its thickness direction. In the ground plane 51, an opening portion 51a is formed at a position facing a conductive portion 91a of the coupling element 91 and its peripheral region, and an opening portion 51b is formed at a position facing a conducive portion 91b of the coupling element 91 and its peripheral region. A rim of each of the opening portions 51a and 51b is partially curved as shown in FIG. 31, whereby a width at a position facing the conductive portion 91a or 91b is larger than a width at any other position.

Even in the thus configured coupler apparatus 50, an amount of electromagnetic energy flowing from the conductive portions 91a and 91b to the ground plane 51 can be reduced while assuring an area of the ground plane 51 as much as possible. Thus, as a result, substantially the same effect as that in the fifth embodiment can be achieved.

Eighth Embodiment

Figure 32:
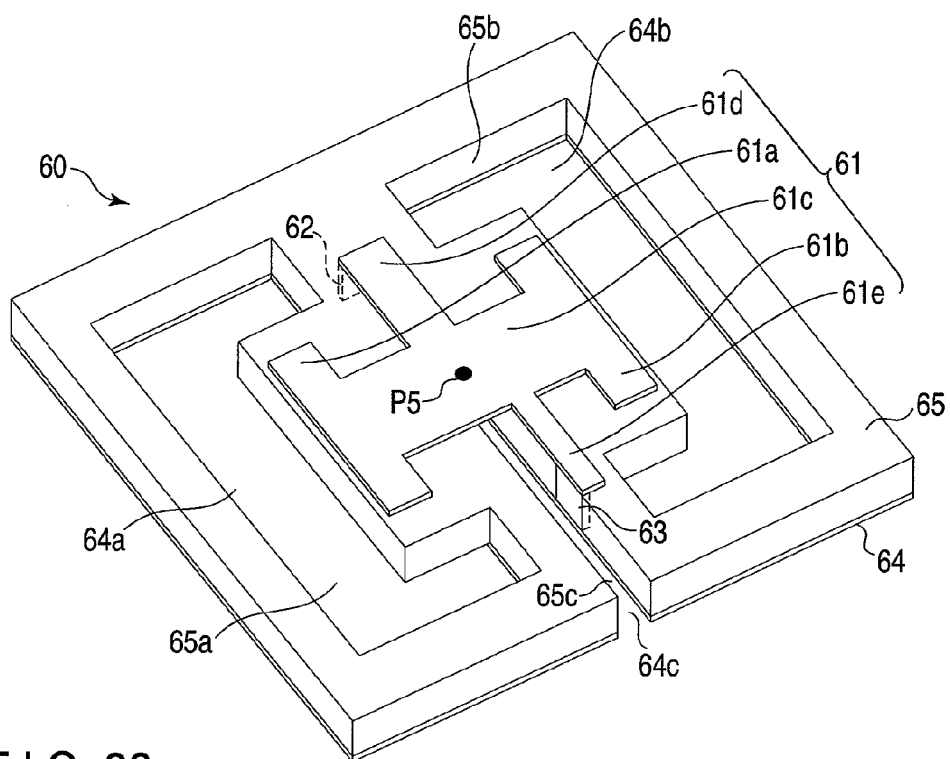
FIG. 32 is a perspective view of a coupler apparatus according to an eighth embodiment.
Figure 33:
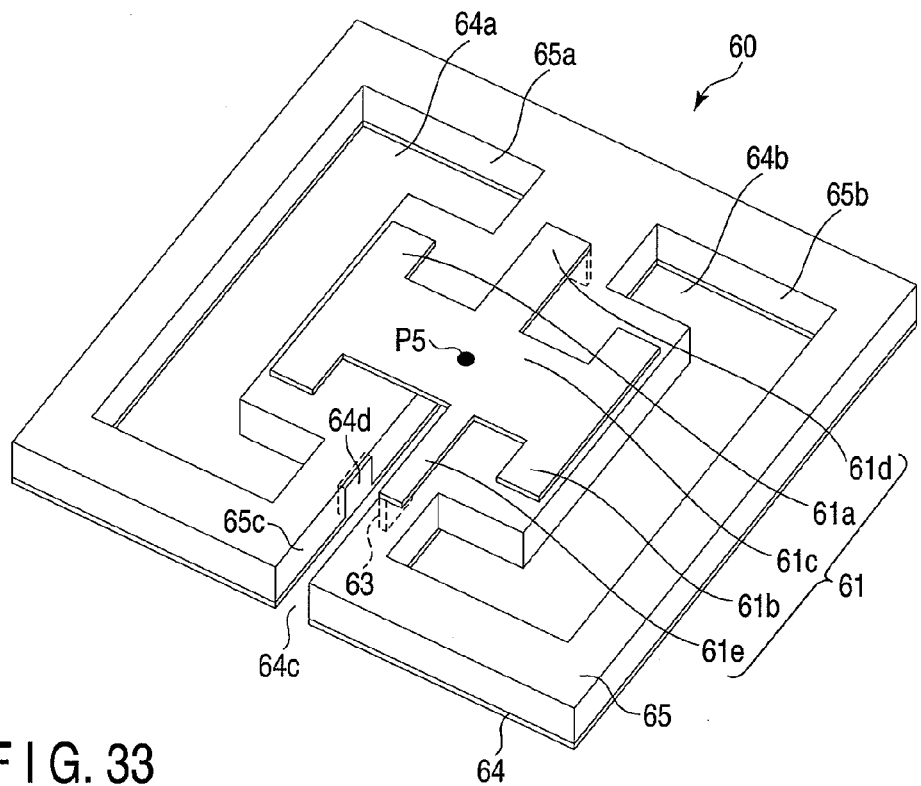
FIG. 33 is a perspective view of the coupler apparatus according to the eighth embodiment.

FIG. 32 and FIG. 33 are perspective views of a coupler apparatus 60 according to an eighth embodiment.

As shown in FIG. 32 and FIG. 33, the coupler apparatus 60 includes a coupling element 61, short elements 62 and 63, a ground plane 64, and a dielectric 65.

Each of the coupling element 61, the ground plane 64, and the dielectric 65 has a tabular shape, and the coupling element 61, the dielectric 65, and the ground plane 64 are aligned in their thickness directions in the mentioned order with these thickness directions being substantially uniformed.

The coupling element 61 is obtained by forming a conductive material into a such a shape as depicted in FIGS. 32 and 33. That is, the coupling element 61 has the following shape on a plane orthogonal to its thickness direction. That coupling element 61 has five conductive portions 61a, 61b, 61c, 61d, and 61e all having a rectangular shape. The conductive portions 61a and 61b are substantially parallel to each other. The both ends of the conductive portion 61c are in contact with intermediate parts of the conductive portions 61a and 61b, respectively. The conductive portions 61d and 61e extend from an intermediate part of the conductive portion 61c to opposite sides to sandwich the conductive portion 61c therebetween. However, the conductive portion 61d is in contact with the conductive portion 61c at a substantially central part of the conductive portion 61c in a longitudinal direction, whereas the conductive portion 61e is in contact with the conductive portion 61c at a position deviating from the center of the conductive portion 61c in the longitudinal direction.

It is to be noted that the conducive portion 61e extends from the conductive portion 61c at a position deviating from the center of the conductive portion 61c in the longitudinal direction in this embodiment, but both the conductive portion 61*d* and the conductive portion 61*e* may extend from the center of the conductive portion 61*c* in the longitudinal direction. When the conductive portion 61*d* and the conductive portion 61*e* are configured to be placed symmetrically with the conductive portion 61 at the center, rotation characteristics can be improved.

Each of the short elements 62 and 63 has a rectangular tabular shape, and its thickness direction is orthogonal to a thickness direction of the coupling element 61. The short element 62 is joined and connected to an end of the conductive portion 61*d*. The short element 63 is joined and connected to the conductive portion 61*e* near an end of the conductive portion 61*e*. The short elements 62 and 63 may be integrated with or separated from the coupling element 61. The short element 62 is arranged to penetrate through the dielectric 65. The short element 62 is electrically connected with the ground plane 64 by using, e.g., a through hole or soldering.

The ground plane 64 is obtained by forming a dielectric material into such a shape as depicted in FIG. 32. That is, the ground plane 64 has the following shape on a plane orthogonal to its thickness direction. In the ground plane 64, a rectangular opening portion 64*a* is formed at a position facing a conductive portion 61*a* of the coupling element 61 and its peripheral region, and a rectangular opening portion 64*b* is formed at a position facing a conductive portion 61*b* of the coupling element 61 and its peripheral region. Further, as shown in FIG. 33, in the ground plane 64, a notch 64*c* that is continuous from a position facing the center of the coupling element to one end of the dielectric 64. Furthermore, in the ground plane 64, a terminal 64*d* vertically raised on a front side from an end portion of the notch 64*c* is formed.

The dielectric 65 is obtained by forming a dielectric material into a tabular shape. The dielectric 65 is arranged in a gap between the coupling element 61 and the ground plane 64. The dielectric 65 has a thickness substantially equal to the gap between the coupling element 61 and the ground plane 64 and fills substantially all of the gap between the coupling element 61 and the ground plane 64. In the dielectric 65, a C-shaped opening portion 65*a* is formed at a position facing a region around a conductive portion 61*a* of the coupling element 61, and a C-shaped opening portion 65*b* is formed at a position facing a region around a conductive portion 61*b* of the coupling element 61. Additionally, in the dielectric 65, a notch 65*c* that is continuous from a position facing the center of the coupling element to one end portion is formed. This notch 65*c* faces the notch 64*c*.

It is to be noted that the notches 64*c* and 65*c* are placed at the center of the ground plane 64 and the dielectric 65 in FIG. 32 and FIG. 33, but they may deviate from this position. Further, the notches 64*c* and 65*c* may be at least partially curved or bent.

The short element 63 is arranged to face the notch 65 and to be opposed to the terminal 64*d*. Both ends of the short 63 are in contact with the coupling element 61 and the ground plane 64.

This coupler apparatus 60 is connected to a transmission/reception circuit mounted in a communication device through a coaxial cable.

Figure 34:
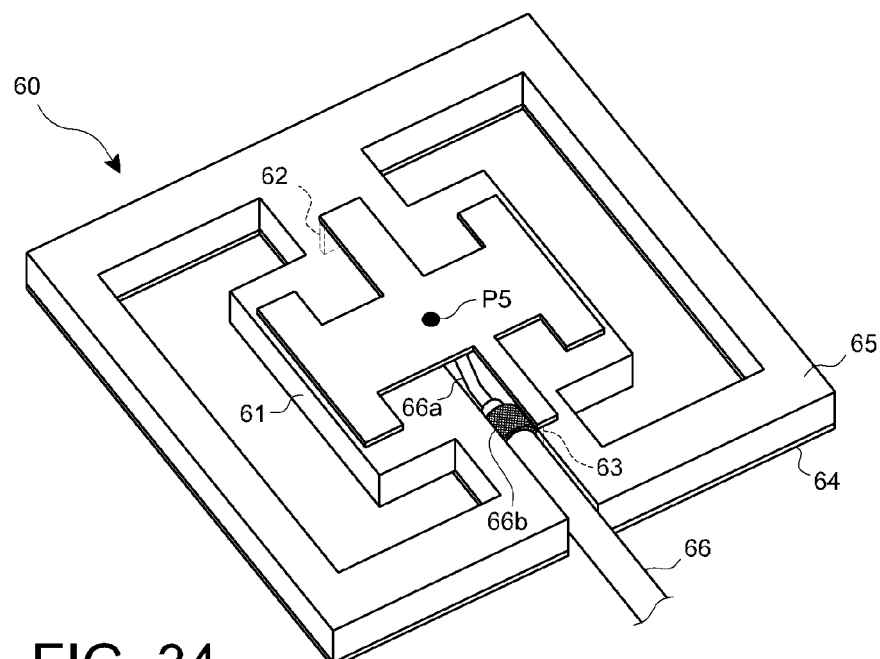
FIG. 34 is a perspective view showing the coupler apparatus depicted in FIG. 32 to which a coaxial cable is connected.

FIG. 34 is a perspective view showing a coupler apparatus 60 connected with a coaxial cable 66.

The coaxial cable 66 is arranged in the notch 65*c*, and an end of this cable is drawn to a position near the center of the conductive portion 61*c*. Furthermore, a inner conductor 66*a* of the coaxial cable 66 is soldered near the central part of the conductive portion 61*c*. Thus, a feeding point P5 is formed at the central part of the conductive portion 61*c*. Moreover, a shield wire 66*b* of the coaxial cable 66 is soldered to the short element 63 and the terminal 64*d*.

Therefore, in the coupler apparatus 60, the end portion of the coaxial cable 66 can be accommodated therein, and electrical connection with this coaxial cable 66 can be also rationally achieved.

Additionally, in the coupler apparatus 60, since the shield wire 66*b* is electrically connected to the coupling element 61 and the ground plane 64 at positions where they face each other to sandwich the notch 65*c* therebetween, a current distribution of the ground plane 94 becomes substantially symmetrical, thereby improving characteristics.

However, the terminal 64*d* can be omitted.

Ninth Embodiment

Figure 35:
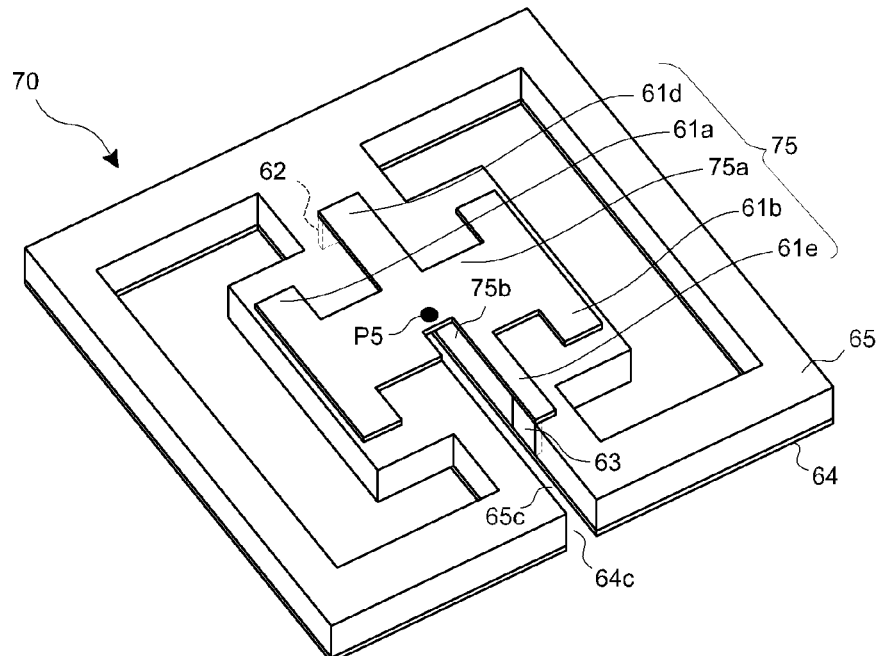
FIG. 35 is a perspective view of a coupler apparatus according to a ninth embodiment.

FIG. 35 is a perspective view of a coupler apparatus 70 according to a ninth embodiment. It is to be noted that like reference numerals denote parts equal to those in FIG. 32 to omit a detailed description thereof.

As shown in FIG. 35, the coupler apparatus 70 includes short elements 62 and 63, a ground plane 64, a dielectric 65, and a coupling element 75.

The coupling element 75 is obtained by forming a dielectric material into such a shape as depicted in FIG. 34. That is, the coupling element 75 has the following shape on a plane orthogonal to its thickness direction. The coupling element 75 has four conductive portions 61*a*, 61*b*, 61*d*, and 61*e* all having a rectangular shape and a substantially rectangular portion 75*a*. That is, the coupling element 75 has the conductive portion 75*a* in place of the conductive portion 61*c* in the coupling element 61. The conductive portion 75*a* has a shape obtained by forming a notch 75*b* in a part of a portion of the conductive portion 61*c* facing the notch 65*c*. The notch 75*b* is formed to avoid a central part of the conductive portion 75*a*.

According to such a coupler apparatus 70, the same effect as that in the eighth embodiment can be obtained, and a position of a feeding point P5 can be moved closer to the central part of the conductive portion 75*a* as compared with the eighth embodiment.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A coupler apparatus which transmits or receives an electromagnetic wave to or from another coupler apparatus, comprising:
    a coupling element formed of a conductive material and comprising two portions and a coupling portion connecting the two portions with each other, the coupling portion comprising a feeding point, and the two portions being symmetrical with respect to the feeding point; and a ground plane formed of a conductive material and comprising two cutouts, each of the cutouts larger than each of the two portions so that each of the two portions face a part of each of the cutouts, wherein:

the two portions comprises a first rectangular portion and a second rectangular portion, the first rectangular portion comprises first and second open ends, the second rectangular portion comprises third and fourth open ends, a first current path is between the feeding point and the first open end through a first half of the coupling element and a first half of the first rectangular portion, a second current path is between the feeding point and the second open end through the first half of the coupling element and a second half of the first rectangular portion, a third current path is between the feeding point and the third open end through a second half of the coupling element and a first half of the second rectangular portion, a fourth current path is between the feeding point and the fourth open end through the second half of the coupling element and a second half of the second rectangular portion, and a length of each of the first, second, third, and fourth current paths corresponds to an integral multiple of ¼ of a wavelength of a central frequency of the electromagnetic wave.

2. The apparatus according to claim 1, further comprising a dielectric between the coupling element and the ground plane.

3. The apparatus according to claim 1, further comprising a dielectric between the coupling element and the ground plane, wherein the dielectric comprises two cutouts, each of the cutouts of the dielectric element larger than each of the two portions so that a part of each of the cutouts of the dielectric element faces each of the two portions.

4. The apparatus according to claim 3, wherein the coupling element and the ground plane are arranged in a height direction and the two cutouts of the ground plane and the two cutouts of the dielectric have substantially the same shapes and are aligned in the height direction.

5. A notebook computer comprising the coupler apparatus of claim 1.

6. A coupler apparatus comprising:

a coupling element comprising first and second conductive portions parallel to each other, and symmetrical with respect to a feeding point, a third conductive portion comprising the feeding point and to electrically connect central parts of the first and second conductive portions to each other, a fourth conductive portion to extend from a central part of the third conductive portion, and a fifth conductive portion to extend from the central part of the third conductive portion to an opposite side of the fourth conductive portion;

a ground plane comprising sixth and seventh conductive portions parallel to each other, and an eighth conductive portion to extend from respective central parts of the sixth and seventh conductive portions and to electrically connect the sixth and seventh conductive portions to each other;

a first short element to short-circuit the fourth conductive portion and the eighth conductive portion; and a second short element to short-circuit the fifth conductive portion and the eighth conductive portion, wherein a longitudinal direction of the third conductive portion crosses a longitudinal direction of the eighth conductive portion and a part of the third conductive portion faces a part of the eighth conductive portion, and the first, second, third, fourth, and fifth conductive portions are in one plane.

7. The apparatus according to claim 6, wherein the ground plane further comprises at least either ninth and 10th conductive portions to extend toward the seventh conductive portion from the vicinity of both ends of the sixth conductive portion or 11th and 12th conductive portions to extend toward the sixth conductive portion from both ends of the seventh conductive portion, and the ninth and 10th conductive portions are apart from each other, and the 11th and 12th conductive portions are apart from each other.

8. The apparatus according to claim 6, further comprising a dielectric between the coupling element and the ground plane.

9. A notebook computer comprising the coupler apparatus of claim 6.

10. The coupler apparatus according to claim 6, wherein the ground plane comprises two cutouts, each of the two cutouts larger than each of the first and second conductive portions so that each of the first and second conductive portions face a part of each of the two cutouts.

11. The coupler apparatus according to claim 6, further comprising a dielectric between the coupling element and the ground plane.

12. The coupler apparatus according to claim 6, further comprising a dielectric between the coupling element and the ground plane, wherein the dielectric comprises two cutouts, each of the cutouts of the dielectric element larger than each of the two portions so that a part of each of the cutouts of the dielectric element faces each of the two portions.

13. The coupler apparatus according to claim 12, wherein the coupling element and the ground plane are arranged in a height direction and the two cutouts of the ground plane and the two cutouts of the dielectric have substantially the same shapes and are aligned in the height direction.

14. The coupler apparatus according to claim 6, wherein:

the first conductive portion comprises first and second open ends, the second conductive portion comprises third and fourth open ends, a first current path is between the feeding point and the first open end through a first half of the coupling element and a first half of the first rectangular portion, a second current path is between the feeding point and the second open end through the first half of the coupling element and a second half of the first rectangular portion, a third current path is between the feeding point and the third open end through a second half of the coupling element and a first half of the second rectangular portion, a fourth current path is between the feeding point and the fourth open end through the second half of the coupling element and a second half of the second rectangular portion, and a length of each of the first, second, third, and fourth current paths corresponds to an integral multiple of ¼ of a wavelength of a central frequency of the electromagnetic wave.

15. A coupler apparatus comprising:
a coupling element which has a feeding point and first and second conductive portions parallel to each other and symmetrical with respect to the feeding point, a third conductive portion comprising the feeding point and electrically to connect central parts of the first and second conductive portions to each other, a fourth conductive portion to extend a central part of the third conductive portion, and a fifth conductive portion to extend from the central part of the third conductive portion to an opposite side of the fourth conductive portion;
a conductive ground plane comprising a first cutout and a second cutout, the first cutout larger than the first conductive portion so that the first conductive portion faces a part of the first cutout, the second cutout larger than the second conductive portion so that the second conductive portion faces a part of the second cutout, a width of the first cutout in a direction orthogonal to a longitudinal direction of the first conductive portion being larger at a position facing the first conductive portion than that at any other position and a width of the second cutout in a direction orthogonal to a longitudinal direction of the second conductive portion being larger that at a position facing the second conductive portion than any other position are formed;
a first short element to short-circuit the fourth conductive portion and the ground plane; and
a second-short element to short-circuit the fifth conductive portion and the ground plane,
wherein the first, second, third, fourth, and fifth conductive portions are in one plane.

16. A notebook computer comprising the coupler apparatus of claim 15.

17. The coupler apparatus according to claim 15, wherein a shape of the first cutout is a rectangular, one side of the rectangular comprising a protrusion or an arc.

18. The coupler apparatus of according to claim 15, further comprising a dielectric between the coupling element and the ground plane.

19. The coupler apparatus according to claim 15, further comprising a dielectric between the coupling element and the ground plane,
wherein the dielectric comprises two cutouts, each of the cutouts of the dielectric element larger than each of the two portions so that a part of each of the cutouts of the dielectric element faces each of the two portions.

20. The coupler apparatus according to claim 19, wherein the coupling element and the ground plane are arranged in a height direction and the two cutouts of the ground plane and the two cutouts of the dielectric have substantially the same shapes and are aligned in the height direction.

21. The coupler apparatus according to claim 15, wherein:
the first conductive portion comprises first and second open ends,
the second conductive portion comprises third and fourth open ends,
a first current path is between the feeding point and the first open end through a first half of the coupling element and a first half of the first rectangular portion,
a second current path is between the feeding point and the second open end through the first half of the coupling element and a second half of the first rectangular portion,
a third current path is between the feeding point and the third open end through a second half of the coupling element and a first half of the second rectangular portion,
a fourth current path is between the feeding point and the fourth open end through the second half of the coupling element and a second half of the second rectangular portion, and
a length of each of the first, second, third, and fourth current paths corresponds to an integral multiple of ¼ of a wavelength of a central frequency of the electromagnetic wave.

* * * * *